(12) United States Patent
Iyer et al.

(10) Patent No.: US 8,902,672 B2
(45) Date of Patent: Dec. 2, 2014

(54) METHODS AND APPARATUS FOR DESIGNING AND CONSTRUCTING MULTI-PORT MEMORY CIRCUITS

(71) Applicants: Sundar Iyer, Palo Alto, CA (US); Shang-Tse Chuang, Los Altos, CA (US); Thu Nguyen, Palo Alto, CA (US); Sanjeev Joshi, San Jose, CA (US); Adam Kablanian, Los Altos Hills, CA (US); Kartik Mohanram, Pittsburgh, PA (US)

(72) Inventors: Sundar Iyer, Palo Alto, CA (US); Shang-Tse Chuang, Los Altos, CA (US); Thu Nguyen, Palo Alto, CA (US); Sanjeev Joshi, San Jose, CA (US); Adam Kablanian, Los Altos Hills, CA (US); Kartik Mohanram, Pittsburgh, PA (US)

(73) Assignee: Memoir Systems, Inc., Santa Clara, CA (US)

(*) Notice: Subject to any disclaimer, the term of this patent is extended or adjusted under 35 U.S.C. 154(b) by 0 days.

(21) Appl. No.: 13/732,372

(22) Filed: Jan. 1, 2013

(65) Prior Publication Data
US 2014/0185364 A1   Jul. 3, 2014

(51) Int. Cl.
| | |
|---|---|
| G11C 8/16 | (2006.01) |
| G11C 11/419 | (2006.01) |
| G11C 7/10 | (2006.01) |
| G11C 7/22 | (2006.01) |

(52) U.S. Cl.
CPC ............ *G11C 11/419* (2013.01); *G11C 7/1006* (2013.01); *G11C 8/16* (2013.01); *G11C 7/1075* (2013.01); *G11C 7/22* (2013.01); *G11C 7/1051* (2013.01)
USPC ................................. 365/189.04; 365/230.05

(58) Field of Classification Search
CPC .......... G11C 8/16; G11C 7/22; G11C 7/1075; G11C 7/1006; G11C 7/1051
USPC ....................................... 365/189.04, 230.05
See application file for complete search history.

(56) References Cited

U.S. PATENT DOCUMENTS

| | | | |
|---|---|---|---|
| 2005/0281111 A1* | 12/2005 | Urard et al. .................... | 365/221 |
| 2008/0181040 A1* | 7/2008 | Huang et al. ................... | 365/219 |

\* cited by examiner

*Primary Examiner* — Jason Lappas
(74) *Attorney, Agent, or Firm* — Dag Johansen, Esq.

(57) ABSTRACT

Static random access memory (SRAM) circuits are used in most digital integrated circuits to store data. To handle multiple memory users, an efficient dual port six transistor (6T) SRAM memory cell is proposed. The dual port 6T SRAM cell uses independent word lines and bit lines such that the true side and the false side of the SRAM cell may be accessed independently. Single-ended reads allow the two independent word lines and bit lines to handle two reads in a single cycle using spatial domain multiplexing. Writes can be handled faster that read operations such that two writes can be handled in a single cycle using time division multiplexing. To further improve the operation of the dual port 6T SRAM cell a number of algorithmic techniques are used to improve the operation of the memory system.

7 Claims, 31 Drawing Sheets

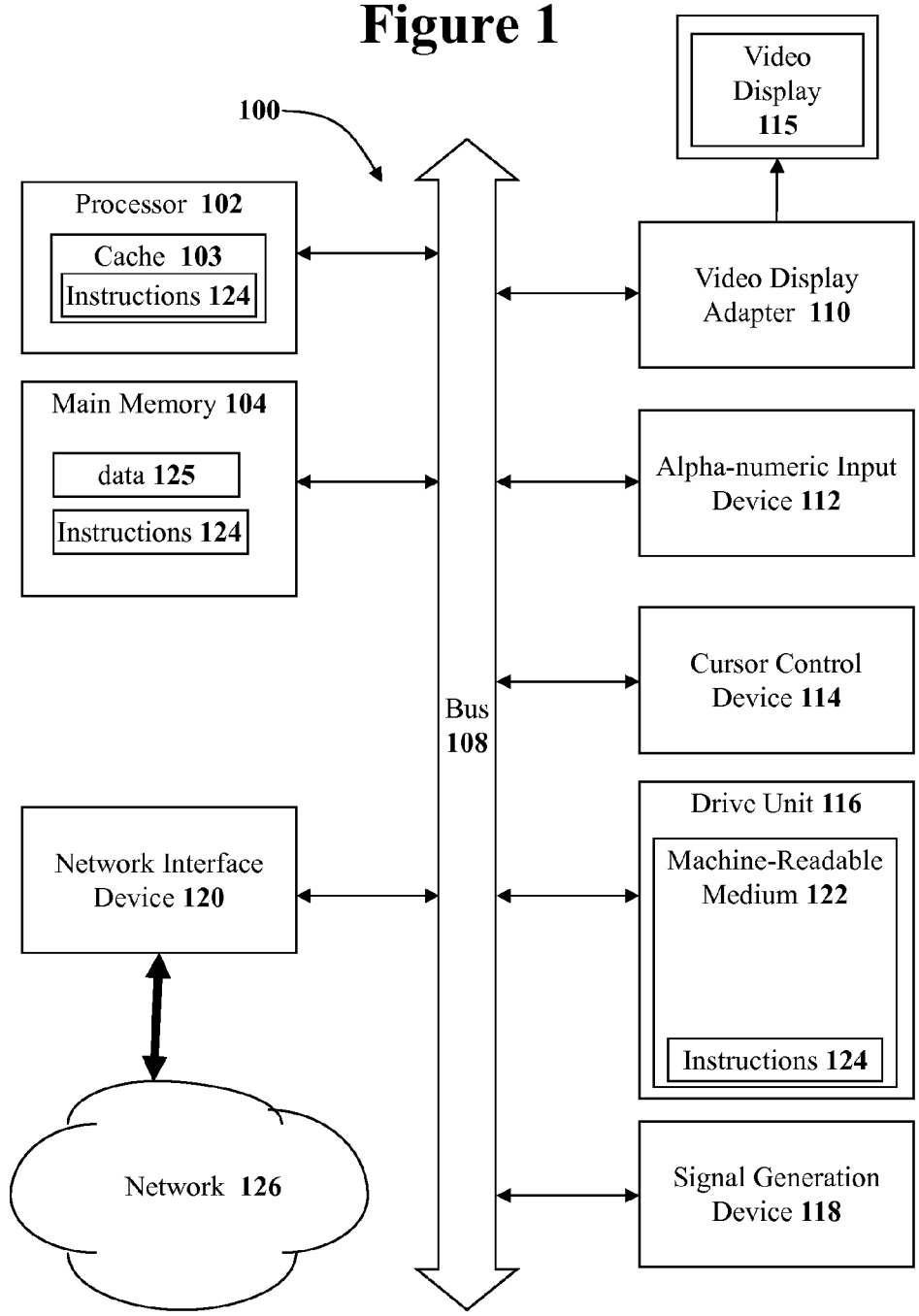

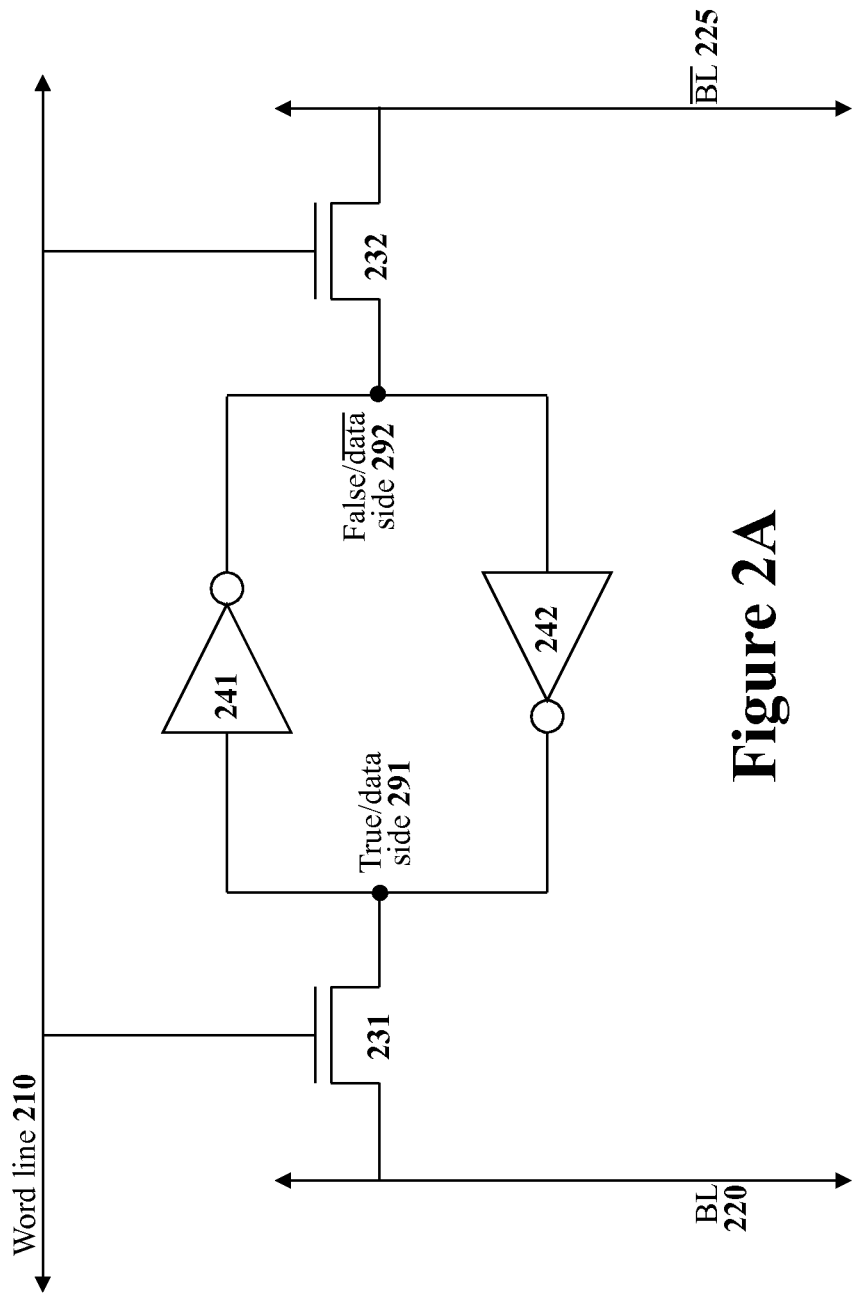

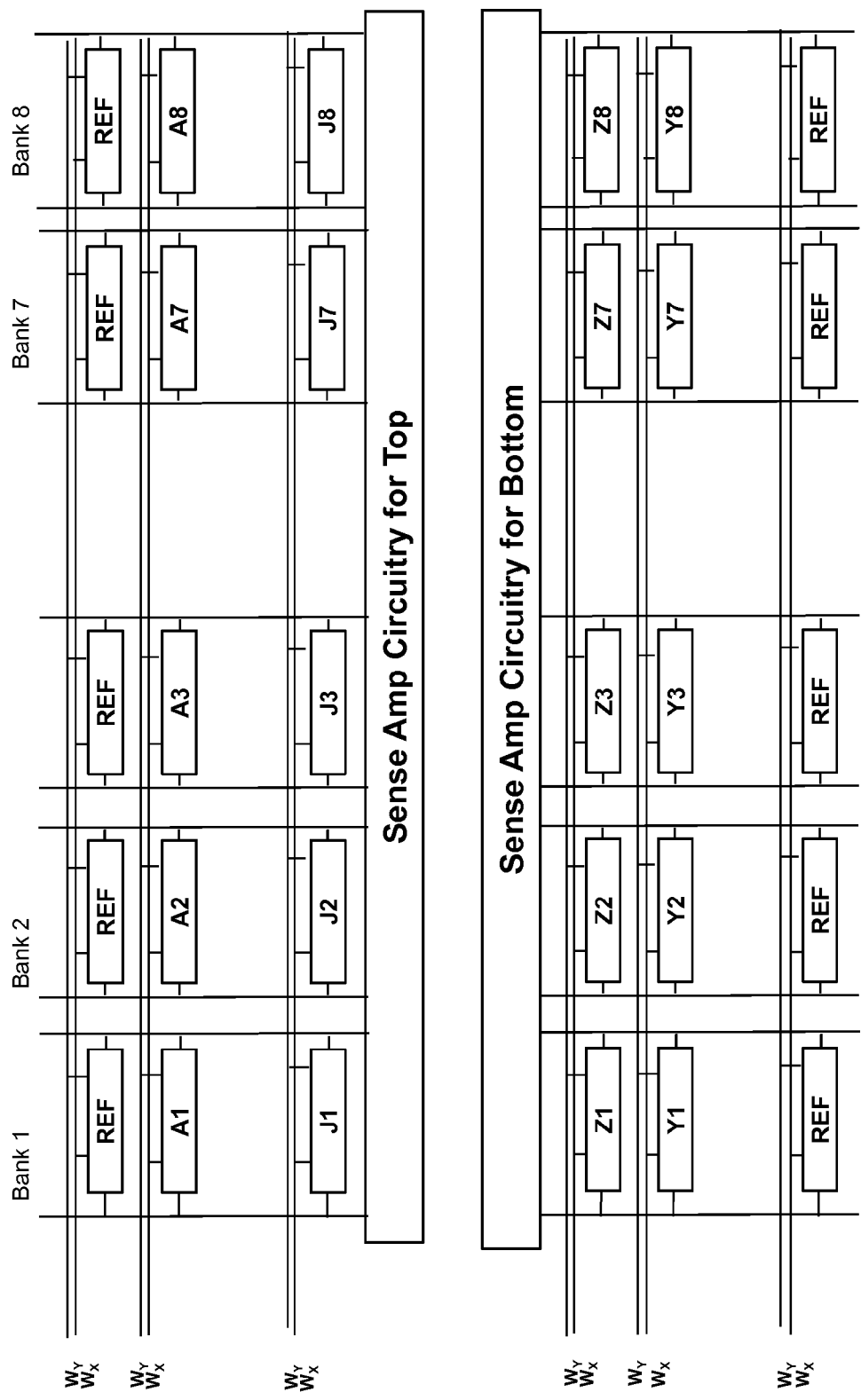

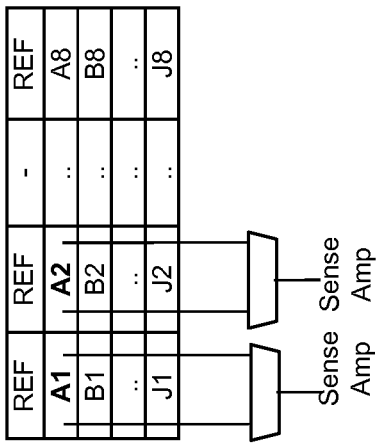
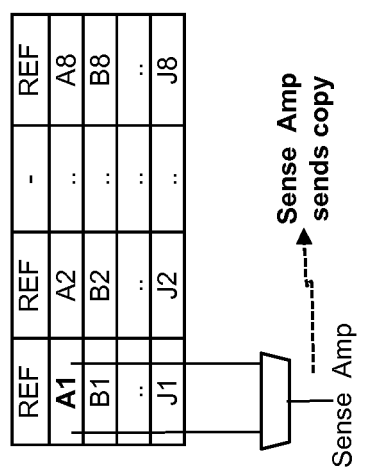
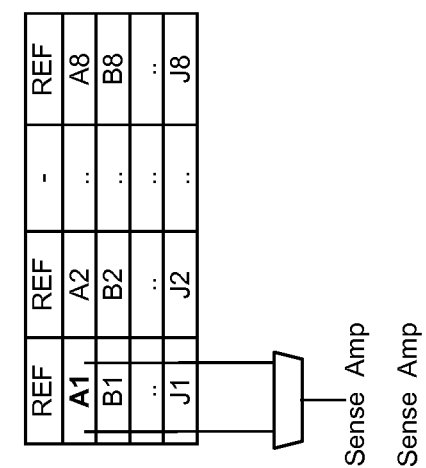
FIG. 7A - Case 1
*(different halves)*
FIG. 7B - Case 2
*(same half, same row, same column)*
FIG. 7C - Case 3
*(same half, same row, different column)*

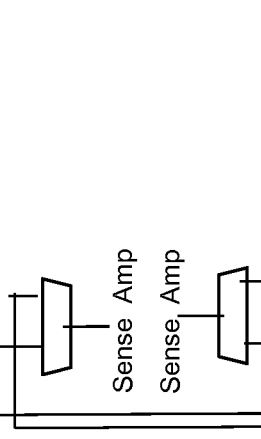
FIG. 7E - Case 5
*(same half, different row, same column)*
FIG. 7D - Case 4
*(same half, different row, different column)*

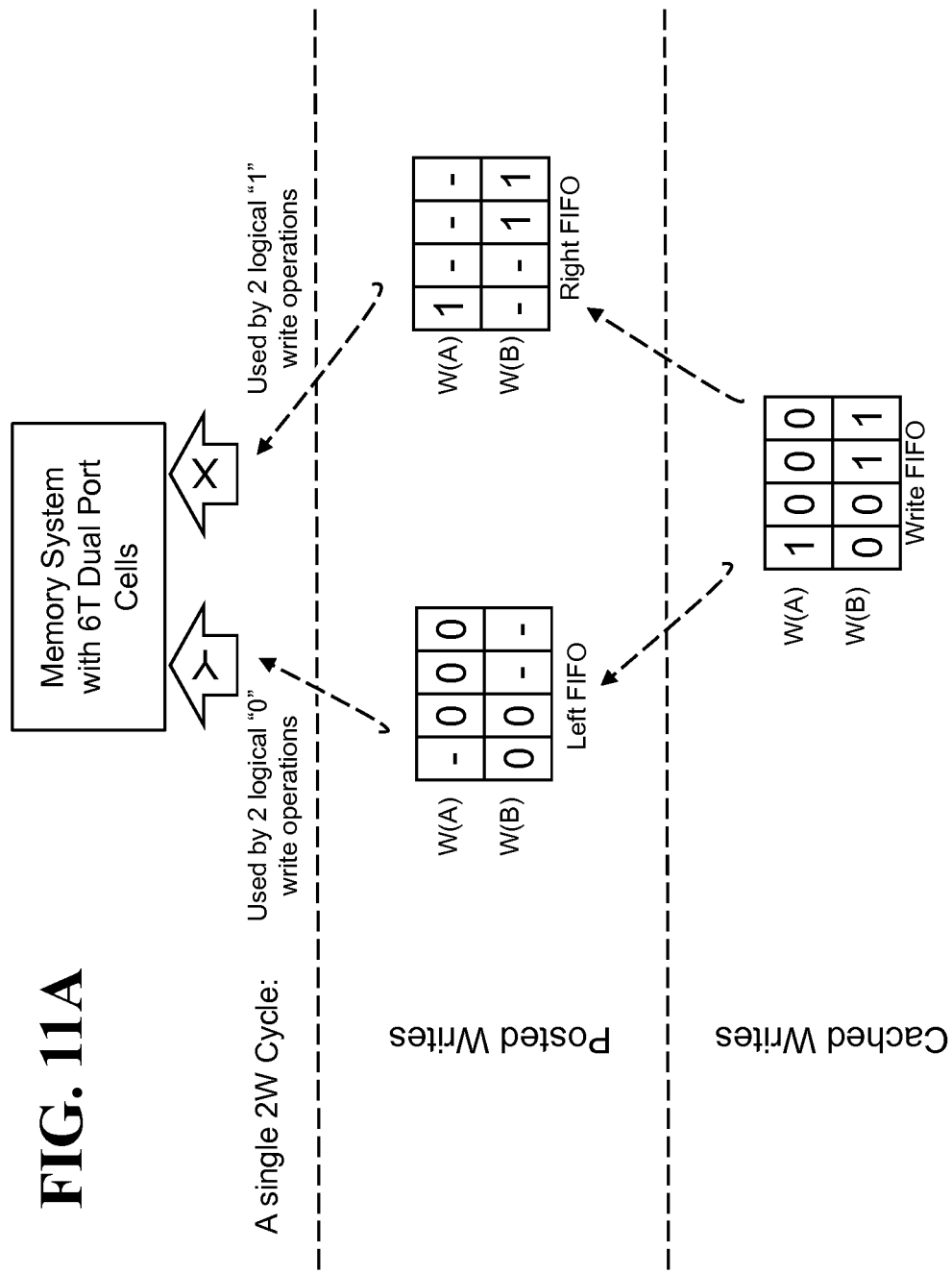

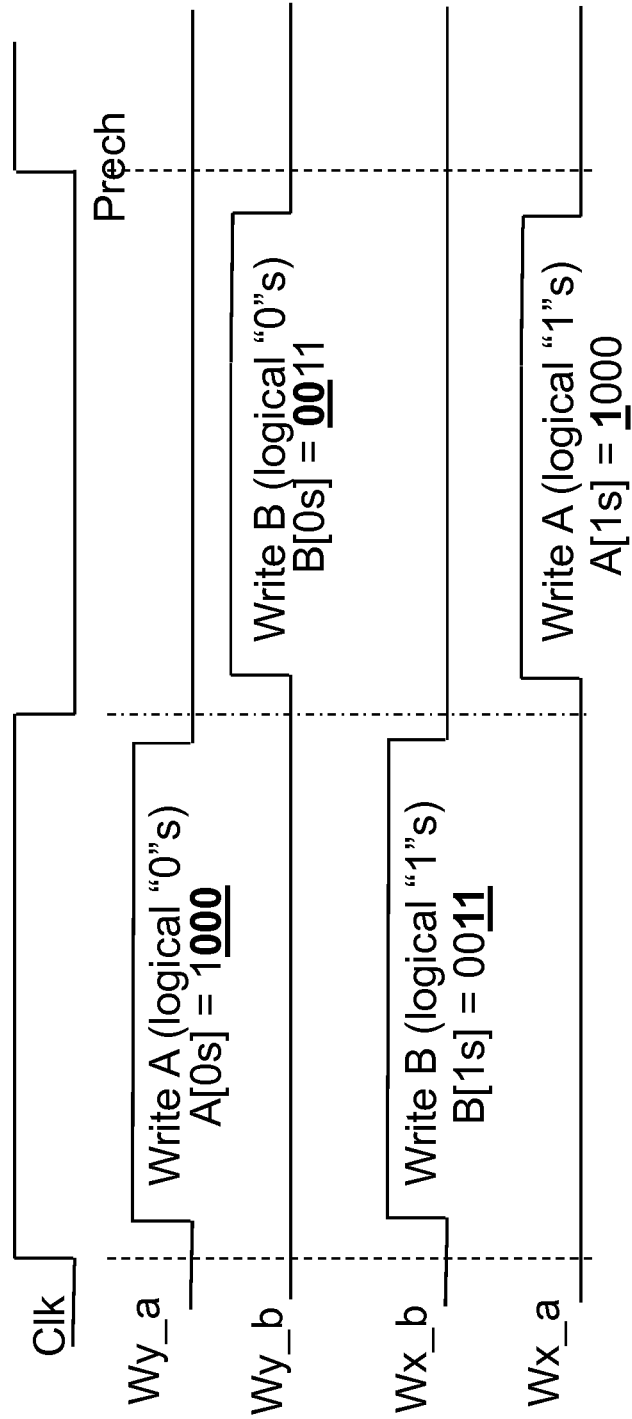

FIG. 12A

| | | | | |
|---|---|---|---|---|
| 0 | 0 | 0 | 0 | Clear (A, B, C, D) |
| - | - | - | 1 | W(A) |
| 1 | - | 1 | - | W(B) |
| - | 1 | 1 | - | W(C) |
| - | - | - | 1 | W(D) |

Left FIFO — 5 Cycles
Only uses 'true' side (Clear row); Only uses 'false' side (W rows)

⇐

| | | | |
|---|---|---|---|
| 0 | 0 | 0 | 1 | W(A) |
| 1 | 0 | 1 | 0 | W(B) |
| 0 | 1 | 1 | 0 | W(C) |
| 0 | 0 | 0 | 1 | W(D) |

Write FIFO — 4 Cycles

FIG. 12B

| | | | | |
|---|---|---|---|---|
| 1 | 1 | 1 | 1 | Set (P, Q, R, S) |
| 0 | 0 | - | - | W(P) |
| - | - | 0 | 0 | W(Q) |
| 0 | 0 | - | 0 | W(R) |
| 0 | 0 | - | 0 | W(S) |

Right FIFO

⇐

| | | | |
|---|---|---|---|
| 0 | 1 | 1 | 1 | W(P) |
| 1 | 1 | 0 | 0 | W(Q) |
| 0 | 0 | 1 | 0 | W(R) |
| 0 | 1 | 0 | 0 | W(S) |

Write FIFO

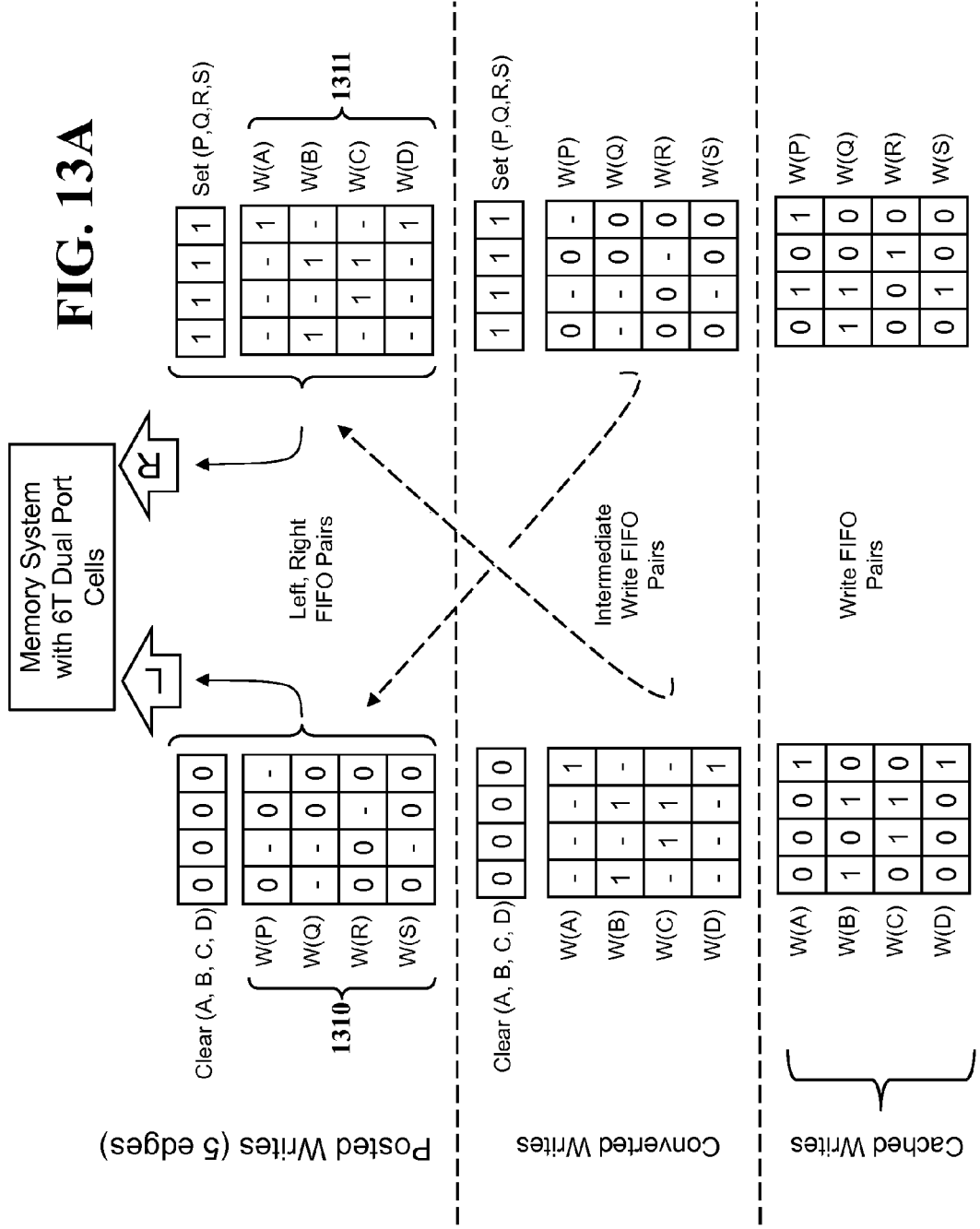

FIG. 13D

Posted Writes

| W(A) | 0 | 0 | 0 | 0 | 0 | - | 0 | 0 |
|------|---|---|---|---|---|---|---|---|
| W(B) | - | - | - | - | - | - | - | - |
| W(C) | - | - | 0 | 0 | 0 | - | - | - |
| W(D) | 0 | 0 | 0 | 0 | 0 | - | 0 | 0 |

Memory System with 6T Dual Port Cells

Note that the bit which stores the encoding must also be accounted for!

In each row, we are assured that one-half of the remaining column bits can be converted to 0's.

Converted Writes

1381 →

| W(A) | 0 | 0 | 0 | 0 | 0 | 0 | 0 | 0 |
|------|---|---|---|---|---|---|---|---|
| W(B) | 1 | 1 | 1 | 1 | 1 | 1 | 1 | 1 |
| W(C) | 1 | 1 | 1 | 1 | 0 | 0 | 0 | 1 |
| W(D) | 0 | 0 | 0 | 0 | 0 | 1 | 0 | 0 |

1. At least 4 of 7 bits are 0, leave "A" unchanged
2. Change at least 2 of remaining 4 bits (bits 5, 6) to zero. Store B's complement
3. Change at least 1 of remaining 2 bits (bit 7) to zero. Store C's complement
4. At least 1 of remaining 1 bit (bit 8) is zero, Store D unchanged.

Cached Writes

| W(A) | 0 | 0 | 0 | 0 | 0 | 1 | 1 | 1 |
|------|---|---|---|---|---|---|---|---|
| W(B) | 0 | 0 | 0 | 0 | 0 | 1 | 1 | 0 |
| W(C) | 0 | 0 | 0 | 0 | 0 | 1 | 1 | 1 |
| W(D) | 0 | 0 | 0 | 0 | 0 | 1 | 1 | 1 |

W=7 Bit wide words for right batch

| Types of Dual Port | Split WL & REF rows 1410 | Zero, One FIFO Writes 1420 | Set and Clear Cache 1430 | Algorithmic Encode 1440 | Normalized Area | Performance | Clock speed |
|---|---|---|---|---|---|---|---|
| Standard 8T | N | N | N | N | 2 | 2 RW | 1 GHz |
| Split word 6T (edges) | Y | N | N | N | 1+ | 2R, 2W | 800 MHz |
| | Y | Y | N | N | 1+ | 2 RW | 800 MHz |
| | Y | Y | Y | N | 1+ | 2R, 1R1.5W, 3W | 800 MHz |
| | Y | Y | Y | Y | 1.12+ | 2R, 1R2W, 4W | 800 MHz |

Algorithmic assists make 6T two-port memory cell progressively more powerful

FIG. 14A

| Types of Dual Port | Split WL & REF rows 1410 | Zero, One FIFO 1420 | Set and Clear Cache 1430 | Algorithmic Encode 1440 | Normalized Area | Performance | Clock speed |
|---|---|---|---|---|---|---|---|
| Standard 8T | N | N | N | N | 2 | 2 RW | 1 GHz |
| Split word 6T (no edges) | Y | N | N | N | 1+ | 2R, 1W | 850 MHz |
|  | Y | Y | N | N | 1+ | 2R, 1R0.5W, 1W | 850 MHz |
|  | Y | Y | Y | N | 1+ | 2R, 1R<1W, <2W | 850 MHz |
|  | Y | Y | Y | Y | 1.12+ | 2RW | 850 MHz |

Algorithmic assists make 6T two-port memory cell progressively more powerful

FIG. 14B

METHODS AND APPARATUS FOR DESIGNING AND CONSTRUCTING MULTI-PORT MEMORY CIRCUITS

RELATED APPLICATIONS

The present U.S. patent application claims the benefit of the previous U.S. Provisional Patent Application entitled "Methods and Apparatus for Designing and Constructing Multi-Port Memory Circuits" filed on Dec. 31, 2011 having Ser. No. 61/582,337.

TECHNICAL FIELD

The present invention relates to the field of digital memory circuits. In particular, but not by way of limitation, the present invention discloses techniques for designing and constructing multi-port memory circuits.

BACKGROUND

Most digital memory circuits are "single port" memory circuits that can only be read from by a single memory user at a particular time. For example, the well-known standard six-transistor (6T) SRAM memory cell only has a single port for accessing the memory cell. However, for many memory applications it is desirable to have "multi-port" memory circuits where more than one memory user can read from single memory cell at the same time. For example, in a multi-core processor system it is advantageous to allow multiple cores to read from the same memory cell circuit concurrently.

To allow for multiple concurrent memory readers, memory cell circuits may be altered to include additional memory ports for accessing the memory cell circuit. For example, the standard six-transistor (6T) single-port SRAM memory cell can be made into an eight-transistor (8T) two-port memory cell by adding two more transistors that provide a second port for accessing the memory cell circuit. However, simply adding another physical port to a memory cell circuit introduces a few disadvantages.

A first problem with adding two additional port transistors to a 6T single-port SRAM memory cell circuit to create an 8T two-port SRAM memory cell is that adding two more transistors to the memory cell circuit increases the size of the memory cell circuit. Increasing the size of the memory cell circuit will reduce the memory density and thus reduce the amount of memory that can be manufactured in a defined area. Furthermore, due to the risk of losing the stored data bit during a read of the SRAM memory cell, certain transistors in the 8T SRAM memory cell must be made much larger thus further increasing the size of the 8T two-port SRAM memory cell. The same technique of adding additional port transistors can be used to create three-port memory cells, four-port memory cells, or memory cells with even higher numbers of ports.

As a result of adding additional transistors, multi-port memory cells tend to have very low memory density characteristics. Furthermore, the additional transistors will consume power such that multi-port memory systems consume more power than single-port memory systems. Therefore, it would be desirable to have alternative designs for multi-port memory cells.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 1 illustrates a computer system within which a set of instructions, for causing the machine to perform any one or more of the methodologies discussed herein, may be executed.

FIG. 2A illustrates a typical six transistor (6T) SRAM memory cell.

FIG. 6D illustrates a block diagram of a memory array constructed with the dual port 6T SRAM memory cell of FIG. 6A that has sense amplifiers located in the center of the array.

FIG. 7A conceptually illustrates how two reads addressing different halves of the memory array in FIG. 6D may be handled with differential reads.

FIG. 7B conceptually illustrates how two reads accessing the same address in the memory array in FIG. 6D may be handled with a differential read.

FIG. 7C conceptually illustrates how two reads addressing different columns in the same half of the memory array in FIG. 6D may be handled with differential reads.

FIG. 7D conceptually illustrates how two reads addressing different columns and different rows in the same half of the memory array in FIG. 6D may be handled with pseudo differential read operations.

FIG. 7E conceptually illustrates how two reads addressing different rows in the same column of the same half of the memory array in FIG. 6D may be handled with pseudo differential read operations.

FIG. 11A conceptually illustrates two write operations divided into four partial-write operations wherein a first set of two partial-write operations are handled with a first port and a second set of two partial-write operations are handled with a second port in a single clock cycle.

FIG. 11B illustrates a timing diagram for the four partial-write operations depicted in FIG. 11A.

FIG. 12A conceptually illustrates four writes directed at four different addresses divided into a group clear operation that hits all four addresses and four independent write operations that only write logical ones into the appropriate bits of the four target addresses.

FIG. 12B conceptually illustrates four writes directed at four different addresses divided into a group set operation that hits all four addresses and four independent write operations that only write logical zeros into the appropriate data bits of the four target addresses.

FIG. 13A conceptually illustrates how the eight write operations from FIGS. 12A and 12B may be handled concurrently in five write cycles.

FIG. 13D conceptually illustrates a batch of four writes directed at four different addresses that are converted to ensure that every data bit position includes at least one logical zero such that a simultaneous clear operation can be performed when writing the data into memory.

FIG. 14A illustrates a graph of the various techniques and the performance that can be achieved using the various techniques when write operations are allowed to use clock edges such that two write operations can be performed in each memory cycle.

FIG. 14B illustrates a graph of the various techniques and the performance that can be achieved using the various techniques when only one write operation is performed in each memory cycle.

DETAILED DESCRIPTION

Figure 2B:
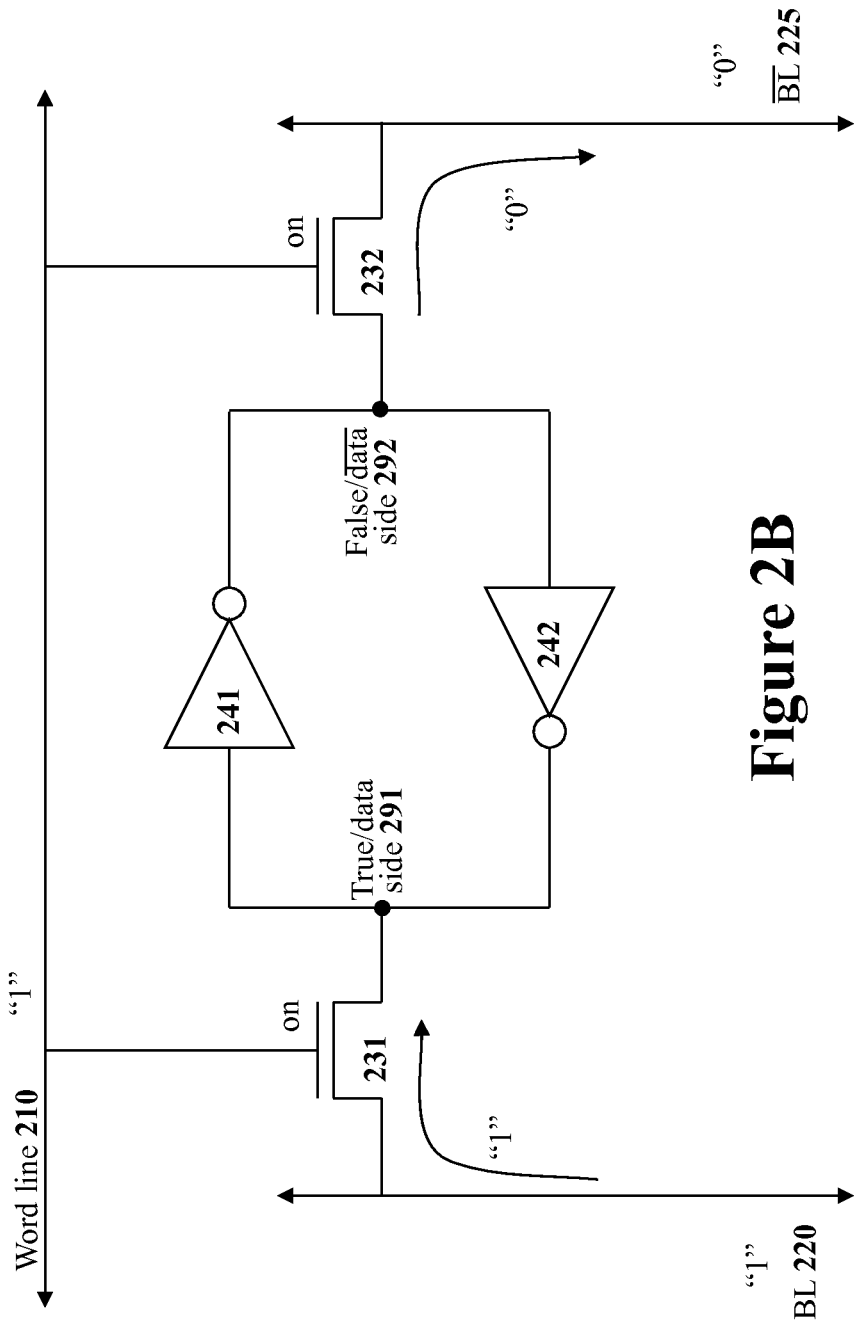
FIG. 2B illustrates the process of writing a logical one into a typical 6T SRAM memory cell.

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some of the example embodiments are disclosed with reference to Static Random Access Memory (SRAM) circuits, the teachings of the present disclosure can be used with many other type of memory circuits. Thus, many different digital memory systems can benefit from the teachings of the present disclosure. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

The present disclosure concerns digital memory devices that are often used in computer systems. FIG. 1 illustrates a diagrammatic representation of a machine in the example form of a computer system 100 that may be used to implement portions of the present disclosure. Within computer system 100 of FIG. 1, there are a set of instructions 124 that may be executed for causing the machine to perform any one or more of the methodologies discussed within this document. Furthermore, while only a single computer is illustrated, the term "computer" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well known File Transport Protocol (FTP). While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Static Random Access Memory (SRAM) Overview

A static random access memory (SRAM) is a type of semiconductor memory circuit that stores each data bit in a simple memory cell circuit that often consists of a pair of connected inverters. FIG. 2A illustrates a typical SRAM cell comprising a pair of inverters 241 and 242. The inverters 241 and 242 are typically connected in a loop circuit wherein the output of each inverter is coupled to the input of the other inverter. One side of the memory cell circuit is referred to as the data or "true" side 291 that stores the true data bit value and the other side of the memory cell circuit is referred to as the data-complement or "false" side 291 that stores the logical inverse of the stored data bit.

To write a data bit into the memory cell or read a data bit from the memory cell, there are a pair of port transistors 231 and 232 that are coupled to word line 210. The port transistors 231 and 232 receive data from (for write operations) or drive data on (for read operations) a pair of data bit lines: bit line (BL) 220 and bit line-complement 225. FIG. 2B illustrates an example of writing a "1" data bit (generally represented by a positive voltage value) into the data side 291 and a "0" data bit (generally represented by ground) into the data-complement side 292 of the memory cell through port transistors 231 and 232, respectively, while the word line 210 is turned on.

Figure 2C:
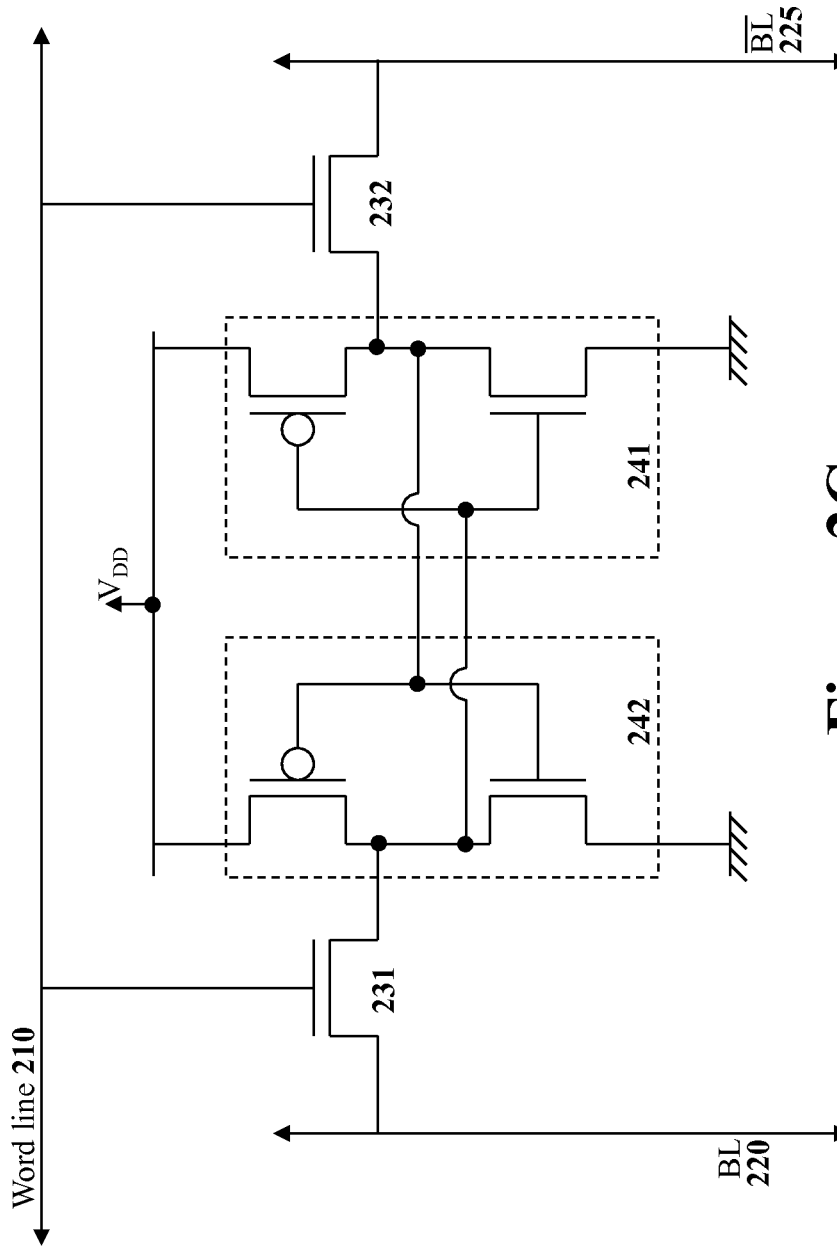
FIG. 2C illustrates a full transistor view of a typical 6T SRAM memory cell.

FIG. 2C illustrates the SRAM cell FIG. 2A with the inverter symbols replaced with actual transistors that may be used to implement the inverters (241 and 242). Each inverter may be implemented with a PMOS transistor and an NMOS transistor. Since there are two transistors for each of the two inverters (241 and 242) and there are two transistors used for ports (231 and 232) into the memory cell, the SRAM cell of FIGS. 2A to 2C is commonly known as a six transistor (6T) SRAM cell circuit.

The physical geometry of the actual circuit components used to construct a 6T SRAM cell circuit is very important in order to guarantee proper operation of the 6T SRAM cell circuit. For example, if the NMOS transistor in the inverter is the same size as the NMOS transistor used as a port transistor into the 6T SRAM cell circuit then the 6T SRAM cell circuit may unintentionally lose data upon read operations. An illustration as to why the physical geometry is very important is set forth with reference to FIG. 3A.

Figure 3A:
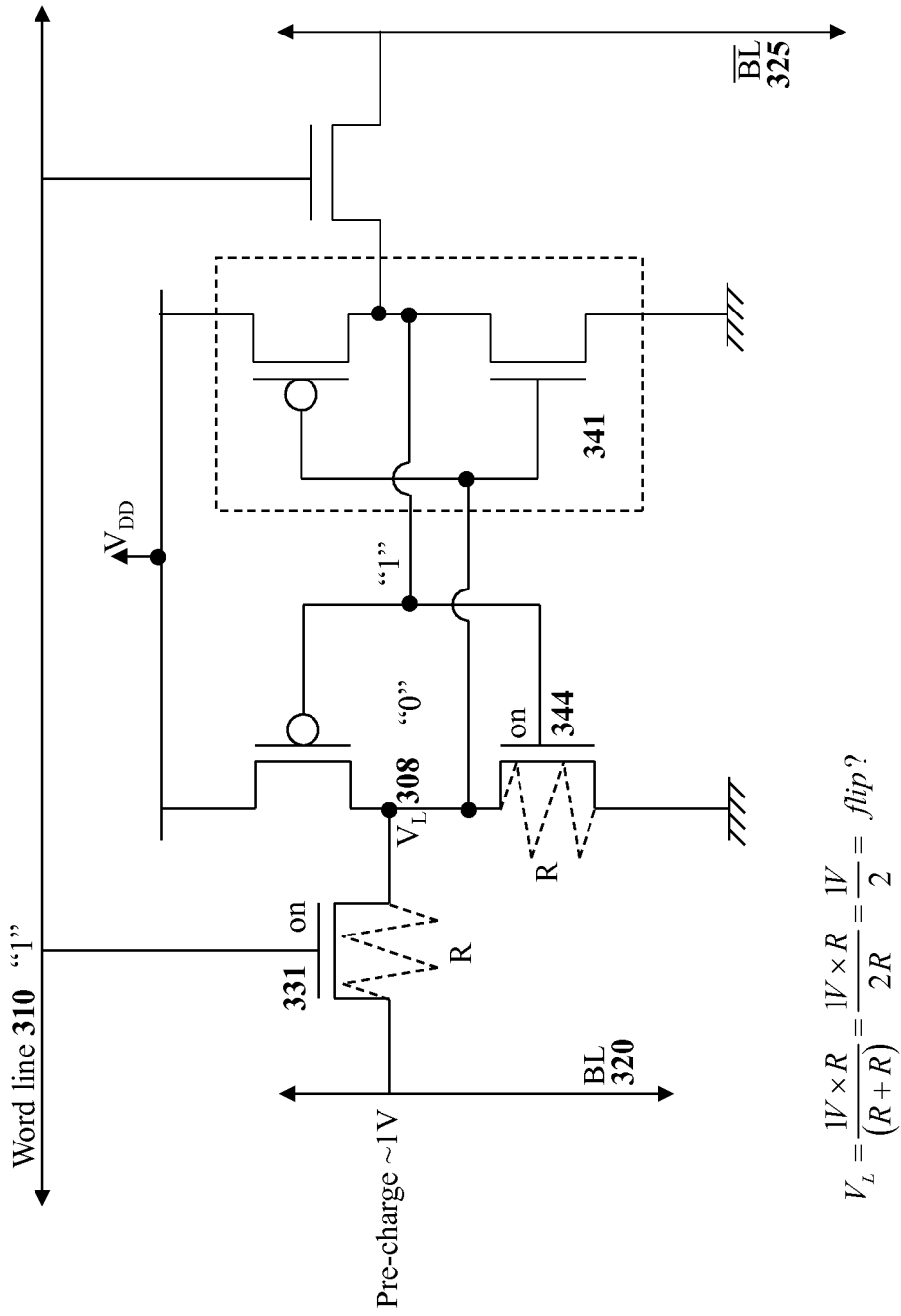
FIG. 3A illustrates a difficult situation created when reading from a typical 6T SRAM memory cell.

FIG. 3A illustrates an example of a 6T SRAM cell circuit that currently stores a "0" data bit (on 'true' side of the cell) that is being read. The 'false' side of the 6T SRAM cell stores a "1" bit that activates the inverter NMOS transistor 344 such that inverter NMOS transistor 344 is turned on. Similarly, the read operation activates port NMOS transistor 331 such that it is turned on. To simplify the analysis in this example, these two turned-on NMOS transistors (344 and 331) act as resistors for time period during the actual read operation.

Before a reading a memory cell in a memory array, the memory system read circuitry generally pre-charges the bit line 320 for the read operation. Assuming port transistor 331 and inverter NMOS transistor 344 are created approximately the same size, the two NMOS transistors (344 and 331) may be assigned a resistance value of R. Thus, when the pre-charged voltage value on the bit line 320 accesses the data side at point $V_L$ 308 in the memory cell, port NMOS transistor 331 and inverter NMOS transistor 344 initially act as a voltage divider circuit that drives the voltage at point $V_L$ 308 to a middle voltage level between the pre-charge voltage and ground since the two transistors have approximately the same resistance R. With the voltage at a middle voltage level, that middle voltage level may accidentally cause the state of the memory cell to flip.

Figure 4:
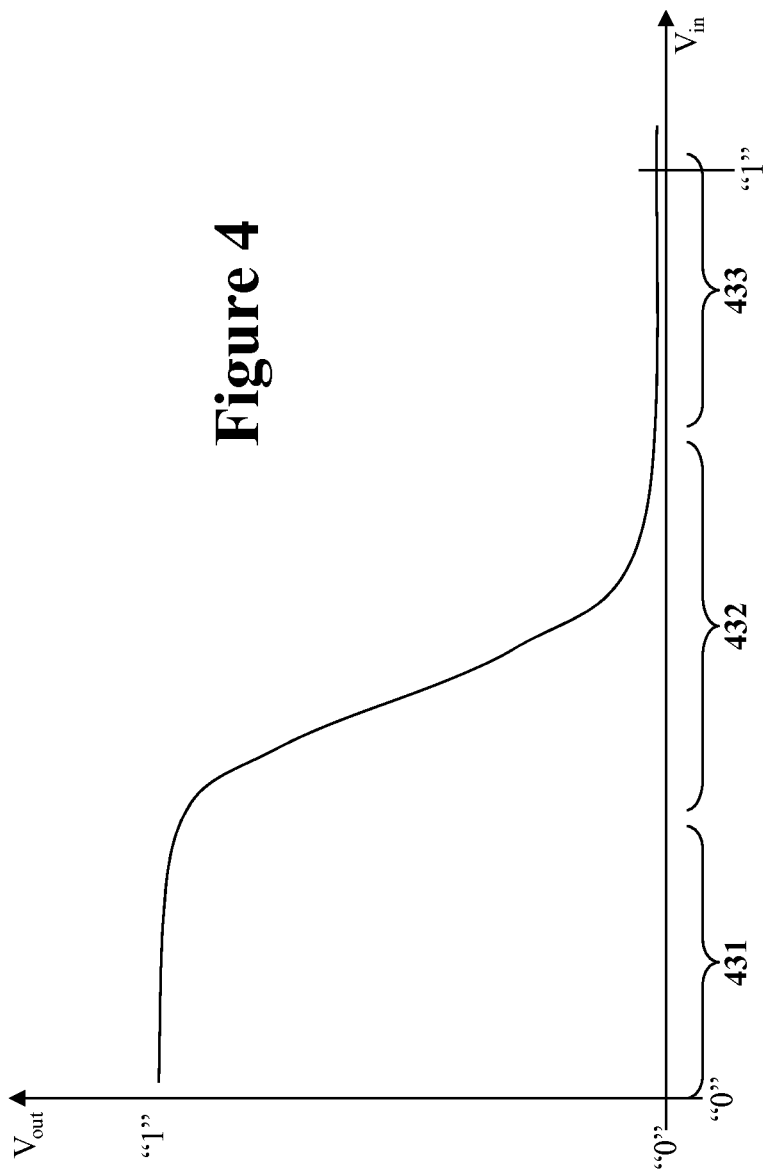
FIG. 4 illustrates the transfer function for a typical inverter.

Driving point $V_L$ 308 to middle voltage level may flip the memory cell due to the inverter circuit 341. FIG. 4 illustrates an example of an inverter transfer function. When the input (horizontal axis) to an inverter circuit is in the low region 431 the output (vertical axis) is high and when the input to an inverter circuit is in the high region 433 the output will be low. However, when an input voltage in the middle region 432, the output may be high, low, or in the middle depending on the input and the specific inverter circuit. Specifically, due to manufacturing differences, the transfer function illustrated in FIG. 4 may be shifted to the left or the right such that the output will vary depending on the specific instance of an inverter circuit. Referring back to FIG. 3A, if the middle voltage value is interpreted as a high value at point $V_L$ 308 then the inverter 341 (driven by the voltage at point $V_L$ 308) may unintentionally flip the data value stored in the memory cell during the read operation.

Figure 3B:
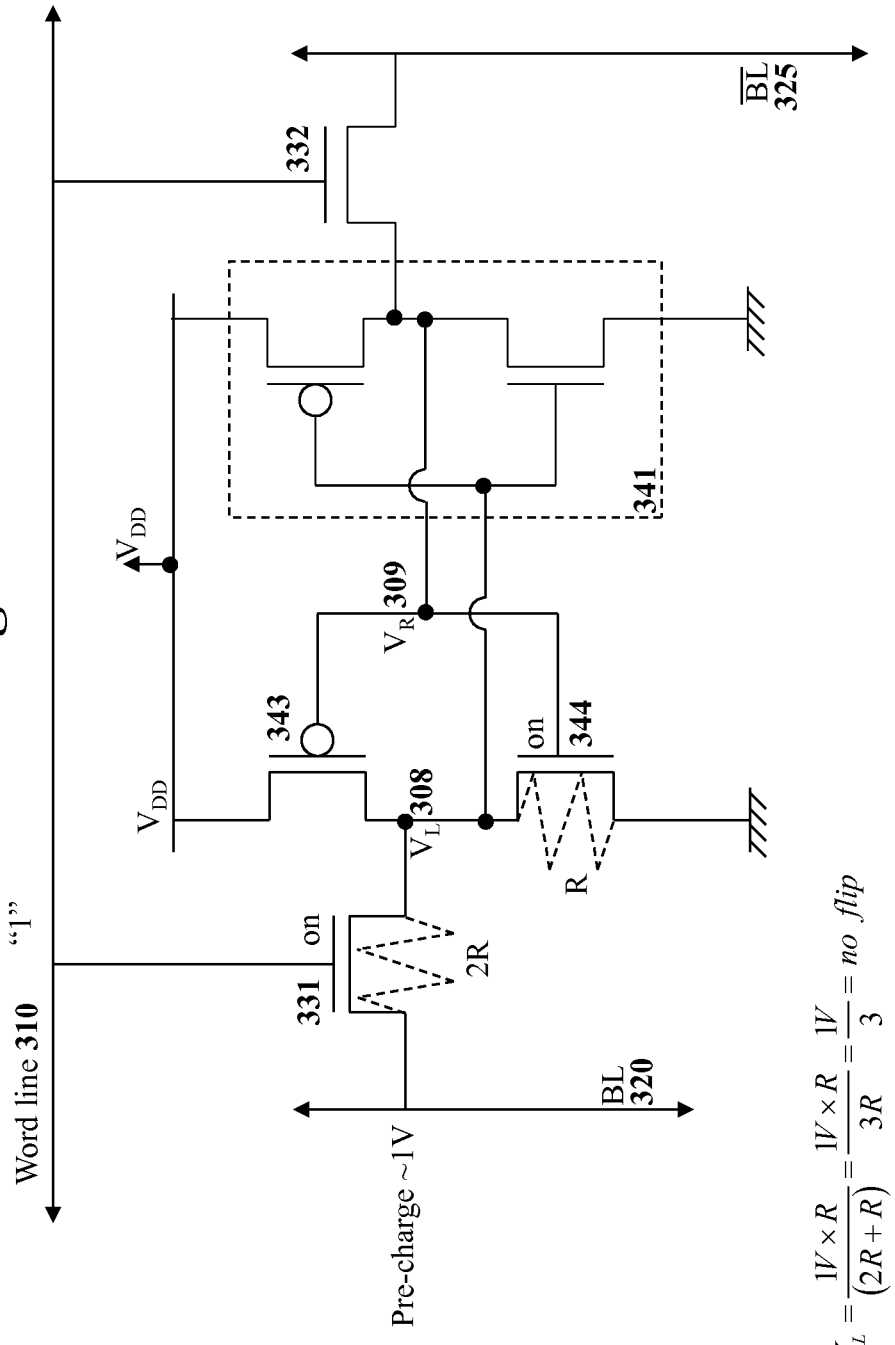
FIG. 3B illustrates how the difficult situation of FIG. 3A is handled with an inverter transistor that is larger than the port transistor.

The simplified example set forth in the preceding paragraphs illustrates how the pre-charge from a read operation may accidentally destroy the data stored in a 6T SRAM cell circuit. To prevent this data destruction from occurring, the size ratio of the inverter NMOS transistor 344 and the port NMOS transistor 331 must be carefully considered. Specifically, in order to prevent having read operations flip the data value stored within the memory cell, the inverter NMOS transistor 344 is generally made larger than the port NMOS transistor 331 such that inverter NMOS transistor 344 will more easily carry current. Thus, when the two transistors (331 and 344) are active (turned-on), inverter NMOS transistor 344 will have a much lower resistance. An illustrative example is presented in FIG. 3B where inverter NMOS transistor 344 has a resistance R and port NMOS transistor 331 has twice the resistance with a resistance value of 2R. When the same read situation occurs, the voltage divider circuit will now have a much smaller voltage drop across inverter NMOS transistor 344 such that the voltage at point $V_L$ 308 will remain low thus ensuring that the 6T SRAM cell circuit will retain the stored data value.

The size ratio of the inverter NMOS transistor 344 and the port NMOS transistor 331 is the important factor. If size ratio (inverter NMOS transistor 344)/(port NMOS transistor 331) is not large enough then the voltage at node $V_L$ 308 may reach the threshold voltage that activates inverter 341 thus causing the memory cell to invert the stored data value during the read operation. The higher the (inverter NMOS transistor 344)/(port NMOS transistor 331) size ratio is the lower the voltage at node $V_L$ 308 will be due to the pre-charge. But to keep the memory cell circuit as small as possible, the ratio should only be as high as necessary to prevent data corruption. In many 6T SRAM cell circuits, the size ratio is 1.2 to 1.5.

8T Dual-Port SRAM

Figure 5A:
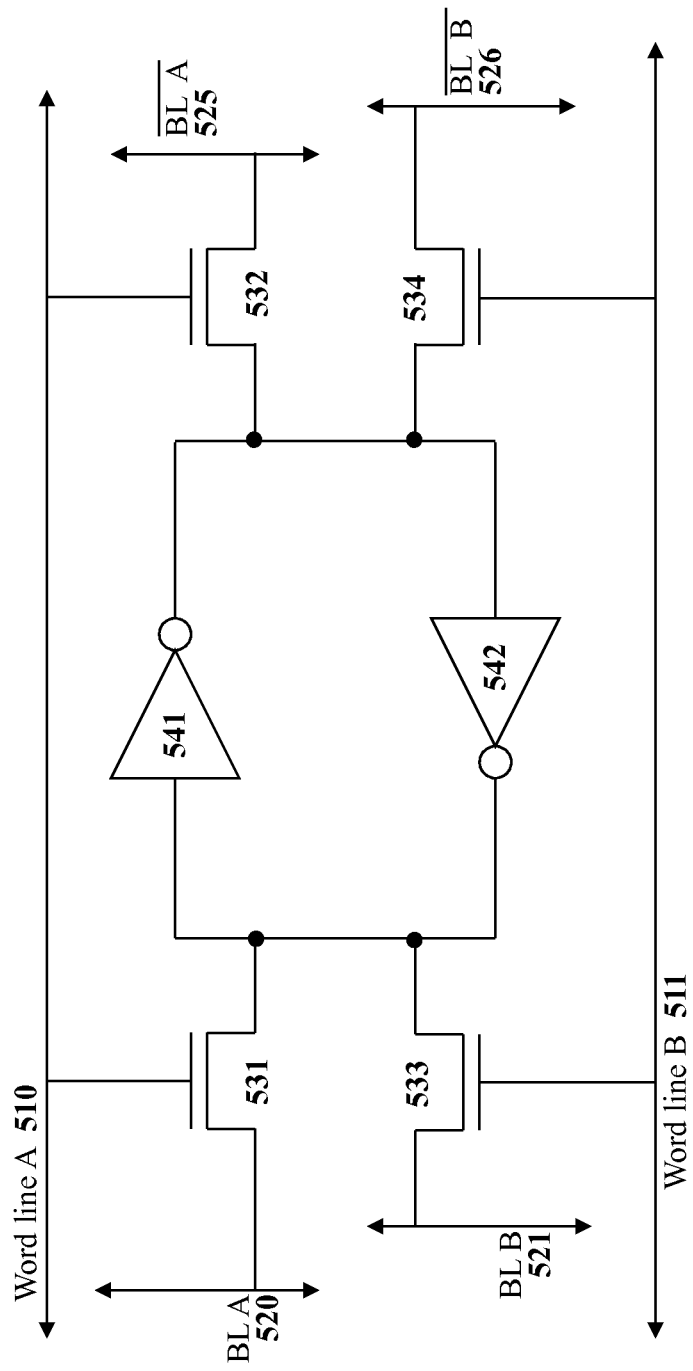
FIG. 5A illustrates a typical dual port eight transistor (8T) SRAM memory cell.

In many memory applications, it is desirable to allow two different entities to access the same SRAM memory cell independently. For example, in a multi-core processor system the different processing cores may wish to access the same memory cell. To allow for this, a second port into a memory cell may be added to the memory cell. FIG. 5A illustrates an example of a typical two-port SRAM cell circuit. The two-port SRAM cell circuit of FIG. 5A is similar to the 6T SRAM cell of FIG. 2A except that in addition to the first pair of complementary port transistors 531 and 532, the two-port memory cell circuit of FIG. 5A also includes a second pair of complementary port NMOS transistors 533 and 534. The second pair of complementary port NMOS transistors 533 and 534 are controlled by a second word line (word line B) 511 and have their own respective bit lines (data bit line B 521 and data-complement bit line B 526). Since two transistors (533 and 534) were added to the memory cell circuit, the memory cell circuit of FIG. 5A is typically referred to as a two-port 8T SRAM cell.

The addition of a second set of complementary port transistors, a second set of complementary bit lines, and an additional word line allows two independent entities to access the contents of the 8T SRAM cell independently of each other. However, this two-port ability comes at a cost of significantly increasing the size of the SRAM cell circuit due to the additional area required to accommodate the additional complementary port transistors, the additional complementary bit lines, and the additional word line.

Figure 5B:
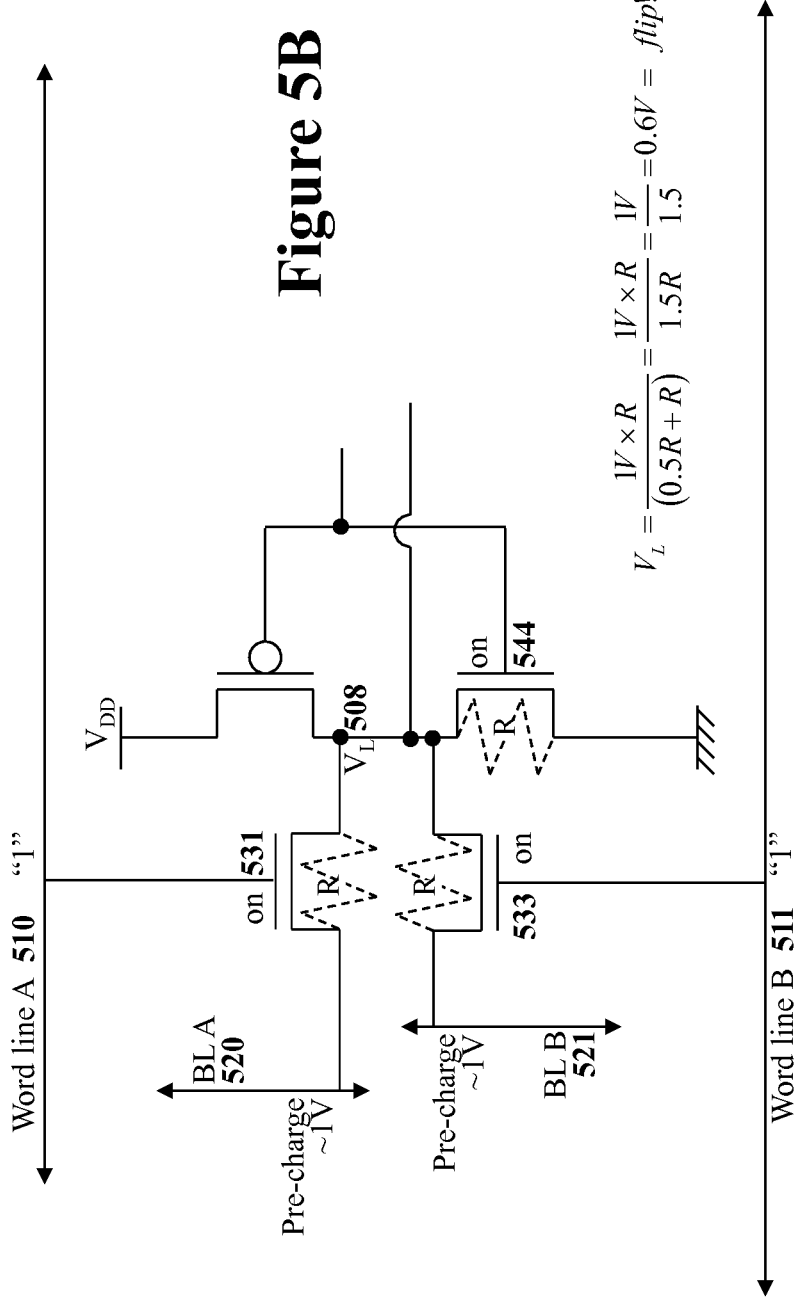
FIG. 5B illustrates a difficult situation that may occur when reading from a dual port 8T SRAM memory cell.

In addition to the added memory cell circuit elements, the NMOS transistors used to implement the inverters within the SRAM cell may need to be made even larger to prevent the loss of data during a read operation. For example, FIG. 5B illustrates half of a two-port 8T SRAM cell circuit wherein two entities are attempting to concurrently read the SRAM cell circuit by accessing both ports into the SRAM cell simultaneously. If all of the transistors are the same physical size and both bit lines are pre-charged then the voltage at data node $V_L$ 508 of the memory cell may be driven to 0.6 times the pre-charge voltage level. Thus, this concurrent read scenario presents a significant risk of unintentionally changing the data value stored in the memory cell during a read operation. To prevent this significant risk of changing the stored data value, the inverter NMOS transistor 544 is typically designed to be significantly larger than the port NMOS transistors 531 and 533 to reduce the resistance across inverter transistor 544 thereby reducing the voltage at data node $V_L$ 508. The transistor size ratio is the key statistic used.

Note that the transistor size ratio of (inverter NMOS transistor 544)/(port transistors 531 or 533) must continue to grow with the number of additional ports added to the SRAM cell. Thus, in the two-port SRAM cell of FIG. 5A the inverter NMOS transistor 544 must be larger than the inverter NMOS transistor 344 in the single port SRAM cell of FIG. 3A. Similarly, with a three-port 10T SRAM cell (not shown), the inverter transistor will be even larger than the inverter transistor 544 in the two-port 8T SRAM cell circuit of FIG. 5A. The inverter transistor size may grow proportionally. For example, if the transistors size ratio used in a single port 6T SRAM cell of is (inverter transistor 344)/(port transistor 231) is selected to be 1.5 then in the two-port 8T SRAM cell the ratio may be (1.5*2)=3 and in a three-port 10T SRAM cell the ratio may be (1.5*3)=4.5. This ratio continues to grow thus making SRAM memory cells with larger numbers of ports very large and cumbersome.

Due the additional circuit elements needed (bit lines, port transistors, and a word line) and the need for a larger NMOS transistor in the inverter circuit, the two-port 8T SRAM cell circuit of FIG. 5A is typically significantly physically larger than the 6T SRAM cell circuit of FIG. 2A. Thus, the memory density (memory data bits per unit area) for a memory system made up of an array of two-port 8T SRAM cell circuits will be significantly lower than memory system made up of an array of one-port 6T SRAM cell circuits. It would therefore be desirable to find other ways of designing two-port SRAM memory cell circuits.

Two Reads with 6T Dual-Port SRAM with Split Word Line

Referring back to FIG. 2A, the basic 6T SRAM cell has two port transistors 231 and 232 with two complementary bit lines 220 and 225. There are two main reasons that two complementary bit lines are used in the standard 6T SRAM cell: (1) the ability to effectively and reliably write data into the memory cell circuit and (2) read access speed.

The critical reason for having two complementary bit lines coupled to a memory cell circuit is that it is very difficult if not impossible to write a "1" data value into a 6T SRAM memory cell circuit from only one side of the 6T SRAM cell circuit. Recall that in FIG. 3B the inverter transistor 344 was constructed much larger than the port transistor 331 in order to prevent the bit line pre-charge voltage of a read operation from destroying a "0" data value when a read operation is performed. For the very same reason that the larger inverter transistor 344 was needed, that larger inverter transistor 344 makes it difficult to write a logical "1" data value into the memory cell circuit. Specifically, the positive voltage (~1V in this example) placed onto bit line 320 when writing a logical "1" passes through port transistor 331 and inverter transistor 344 that together act as a voltage divider. Since inverter transistor 344 is much larger than port transistor 331 and thus has lower resistance, the voltage at point $V_L$ 308 will not be high enough to write a logical "1" data value into the memory cell circuit.

In order to effectively and reliably write a new logical "1" data value into a standard SRAM cell circuit, the complementary bit line 325 is required. Referring back to FIG. 3B, if a positive voltage (logical "1") is placed on bit line 320 during a write operation then a complementary zero voltage value (logical "0") will be placed on the complementary bit line 325. The zero voltage on the complementary bit line 325 will cause a near zero voltage value at point $V_R$ 309 that controls PMOS transistor 343. This near zero voltage value at point $V_R$ 309 turns on PMOS transistor 343 and increases the voltage at point $V_L$ 308 thereby writing a logical "1" into the memory cell circuit. The net effect of this phenomenon is that with a standard 6T SRAM bit cell circuit, only a logical "0" can be written into the memory bit cell circuit. However, since there is both a data/true side of a memory cell circuit and a data-complement/false side of the memory cell circuit, a logical "1" can be written into the memory cell circuit by writing a logical "0" into the data-complement/false side of the memory cell circuit since the inverter will cause the data/true side of the memory cell to become a logical "1".

As noted above, read access speed is a second reason that complementary bit lines are used in a standard 6T SRAM cell circuit. It is possible to read the state of a memory cell circuit by reading from only one side of the memory cell circuit. For example, a memory reading circuit could turn on word line 310 and only sample the data/true side of the standard 6T SRAM cell circuit. However, by accessing both sides of the memory cell circuit, a differential amplifier coupled to the pair of complementary bit lines (320 and 325) can read the state of the memory cell circuit much faster than reading a single end of the memory cell circuit. Thus, traditional 6T SRAM cells generally perform read operations using both sides of the SRAM memory cell circuit.

Figure 6A:
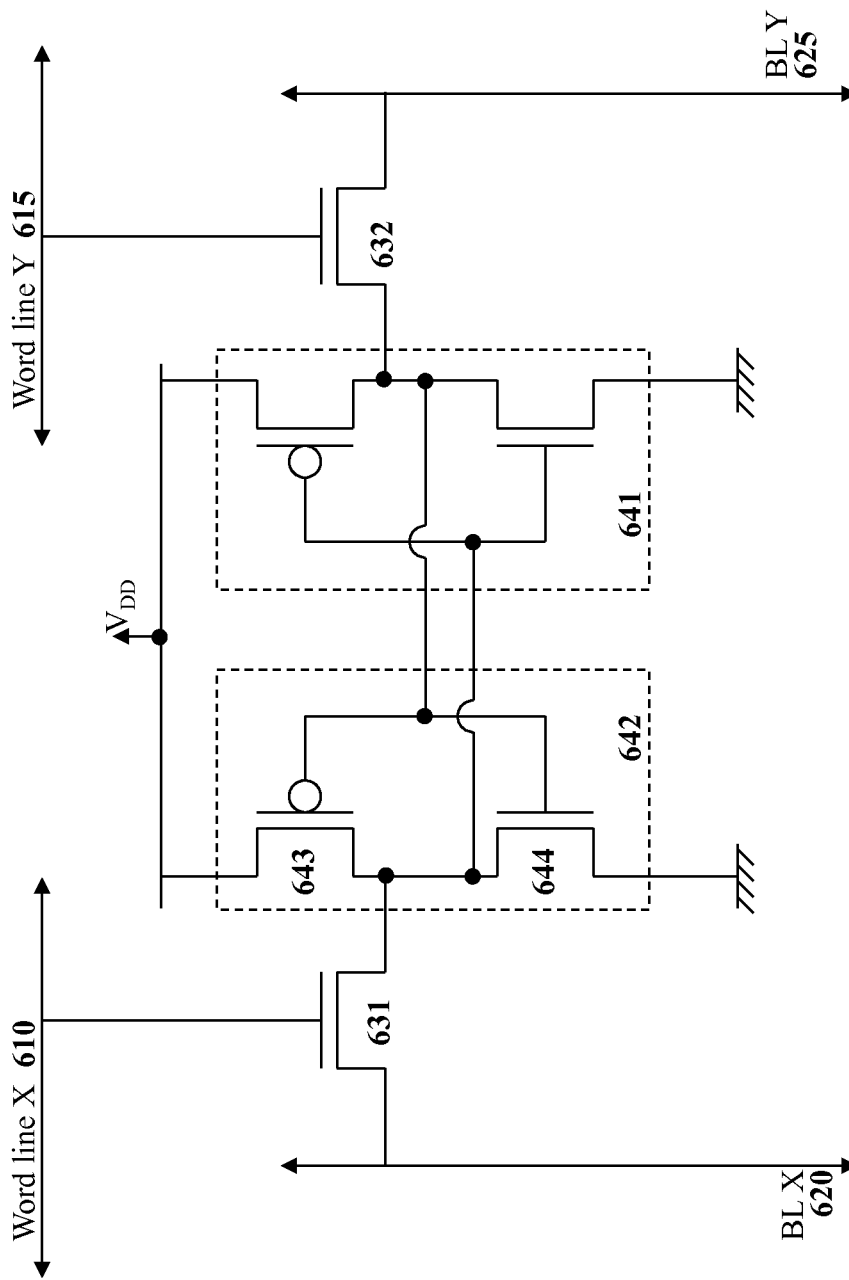
FIG. 6A illustrates a proposed dual port six transistor (6T) SRAM memory cell.
Figure 6B:
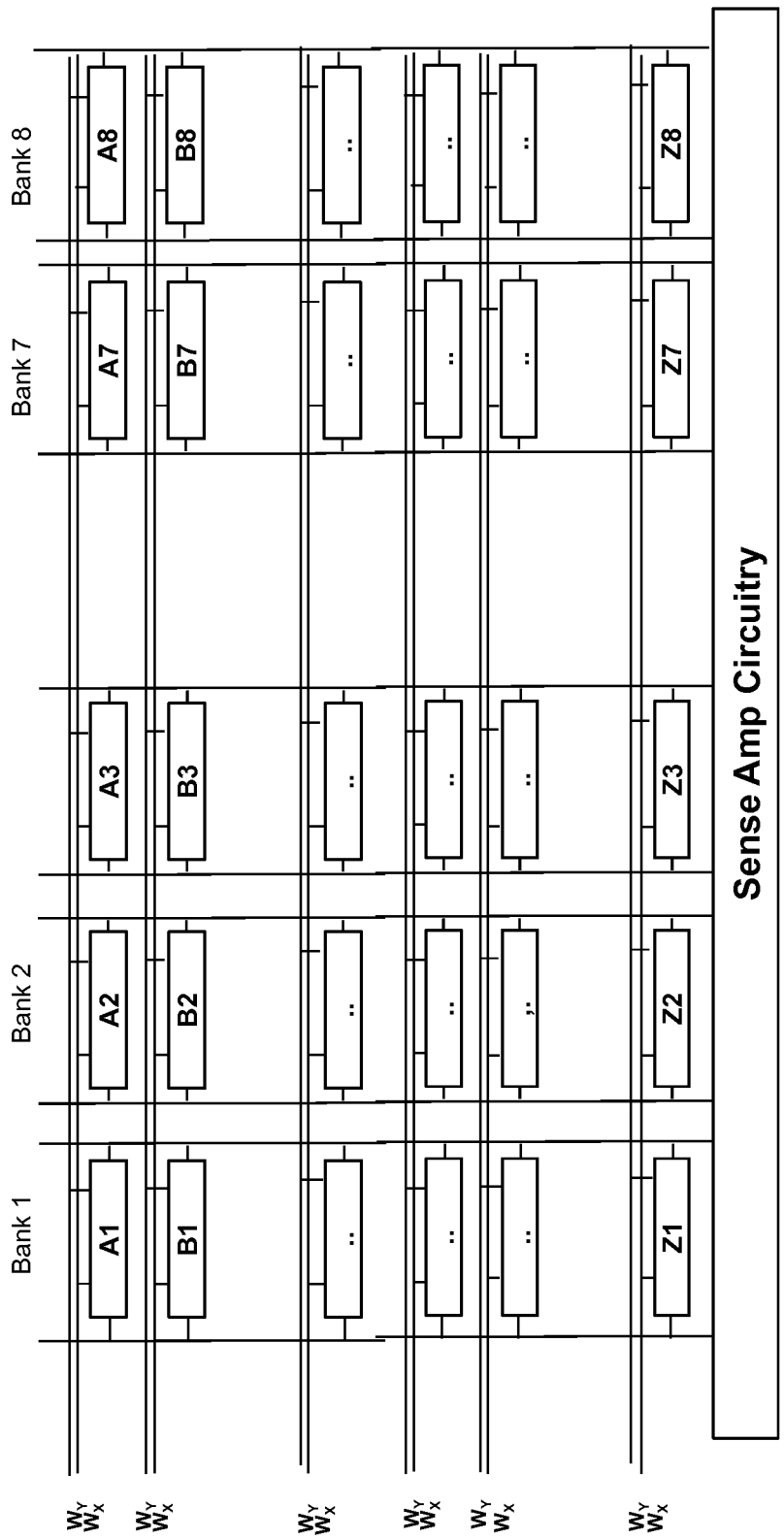
FIG. 6B illustrates a block diagram of a memory array constructed with the dual port 6T SRAM memory cell of FIG. 6A.

If a particular application is willing to accept a slightly slower read operation speed, then the traditional 6T SRAM cell circuit may be modified to create a one write port or two read port (1W or 2R) memory cell circuit. FIG. 6A illustrates a one write port or two read port (1W or 2R) 6T SRAM cell circuit. In the 1W or 2R memory cell circuit of FIG. 6A, there are two independent word lines (word line X 610 and word line Y 615) that each control respective independent port transistors (631 and 632). This configuration is referred to as a "split word line" memory system since there are two independent word lines. FIG. 6B illustrates a block diagram of an entire memory array containing the split-word line 1W or 2R memory cell of FIG. 6A wherein each row of memory cells has two independent word lines $W_y$ and $W_x$.

To perform a write operation into the split word line memory cell circuit of FIG. 6A, both word line X 610 and word line Y 615 are asserted simultaneously for the same row to activate both of the port transistors 631 and 632, respectively. The write circuitry (not shown) then drive bit line X 620 and bit line Y 625 as traditional complementary bit lines where bit line X 620 asserts the data bit and bit line Y 625 asserts the complement of the data bit. Thus, the split word line memory cell circuit of FIG. 6A may operate the same as a traditional 6T memory cell circuit for write operations except that both word lines must be asserted simultaneously.

Figure 8A:
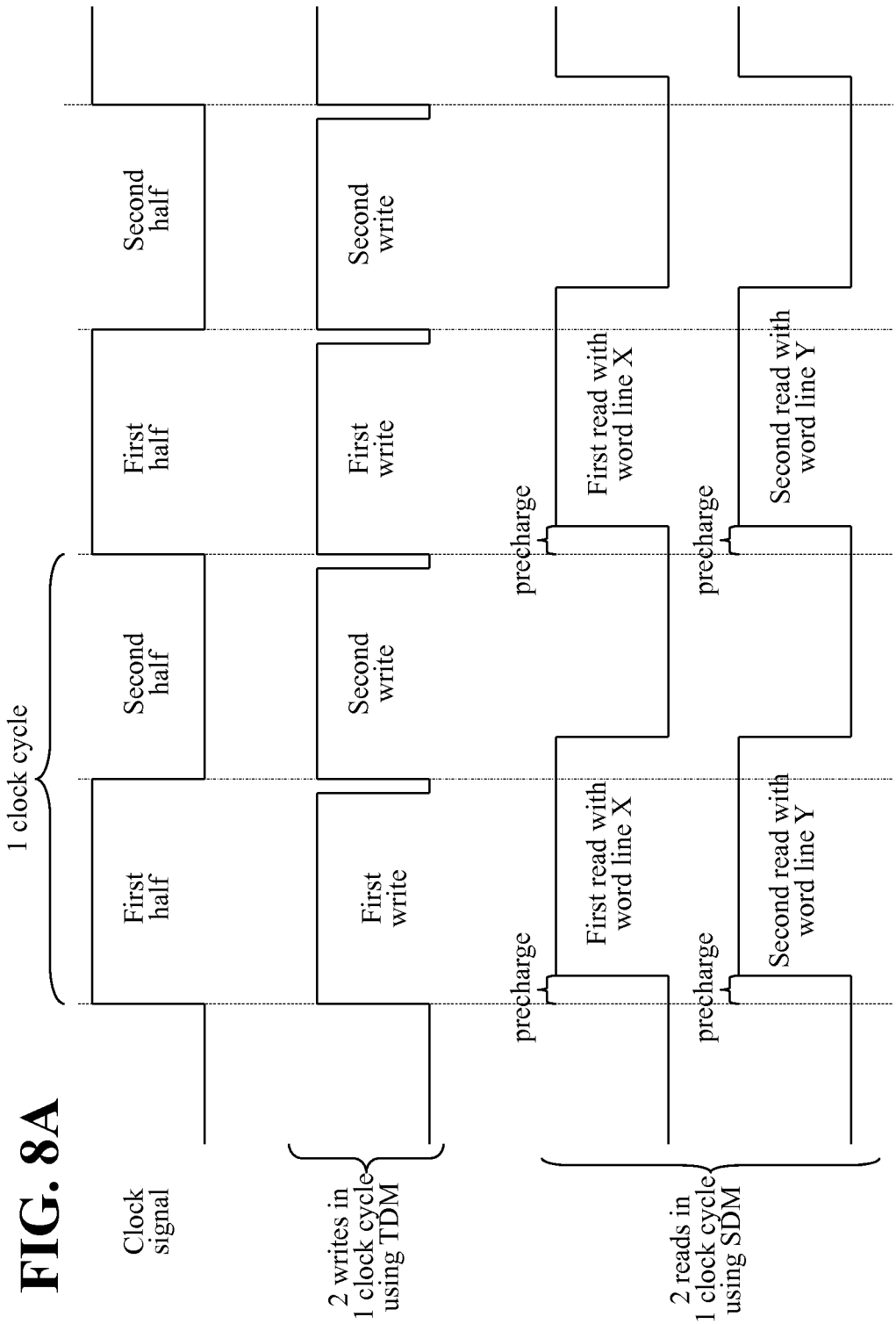
FIG. 8A illustrates a timing diagram of two writes performed with time division multiplexing (TDM) or two reads performed with spatial division multiplexing (SDM).

To perform two concurrent read operations from the memory cell circuit of FIG. 6A, word line X 610 and word line Y 615 may be operated independently for the two different read operations. Word line X 610 is asserted in one row for a first read operation using bit line X 620 and word line Y 615 is asserted (in another row or the same row of the array) for a second concurrent read operation using bit line Y 625 (in another column or the same column of the array). Note that the read operation performed using word line Y 615 and bit line Y 625 will be read from the data-complement/false side of a memory cell such that the read data bit must be inverted for the true data value. The bottom half of FIG. 8A illustrates a timing diagram of two concurrent read operations that may be handled in a single clock cycle using two-port 6T memory cell circuit of FIG. 6A.

The physical construction of the 1W or 2R memory cell of FIG. 6A is very similar to a standard single port 6T SRAM cell of FIG. 2C except that the 1W or 2R memory cell of FIG. 6A requires two independent word lines (word line X 610 and word line Y 615) routed to each SRAM cell circuit. This can be managed by using the standard techniques for routing the two word lines used in the two-port 8T SRAM cell of FIG. 5A with the smaller single port 6T SRAM cell of FIG. 2C. The resulting 1W or 2R memory cell of FIG. 6A will be significantly physically smaller than the two-port 8T SRAM cell of FIG. 5A since there is only one port transistor on each side of the memory cell circuit. Furthermore, there is no need to make the inverter NMOS transistor extra large to prevent a concurrent read operation from accidentally changing the state of the SRAM cell circuit since there is only one bit line coupled to each side of the SRAM cell circuit instead of two bit lines as illustrated in FIGS. 5A and 5B.

In one particular embodiment, the size of the inverter's PMOS transistor 643 and the port transistor 631 in the SRAM cell circuit of FIG. 6A are approximately the same physical size. However, the size of the inverter's NMOS transistor 644 may be approximately 1.5 times as large as the port NMOS transistor 631 in order to prevent read operations from destroying stored data bit values as previously described with reference to FIGS. 3A and 3B.

The two concurrent but independent read operations performed with the memory system of FIGS. 6A and 6B use spatial division multiplexing (SDM) to accomplish the two independent concurrent read operations. Specifically, one area of the memory array space (word line X, bit line X, and a left port transistor) is used for the first read operation and a second area of the memory array space (word line Y, bit line Y, and the right port transistor) is used for the independent second read operation.

Improved Two Reads with 6T Dual-Port SRAM with Split Word Line

The memory system of FIGS. 6A and 6B allows for either one write operation (1W) or two concurrent read operations (2R) during each memory cycle. However, the "single-ended" read operations will not be as fast as normal differential read operations that require the use of two complementary bit lines. Specifically, the small SRAM cell circuit lacks the power to quickly drive a single ended data value. To improve upon this situation, a "pseudo differential read" may be performed to increase the speed of the read operation.

Figure 6C:
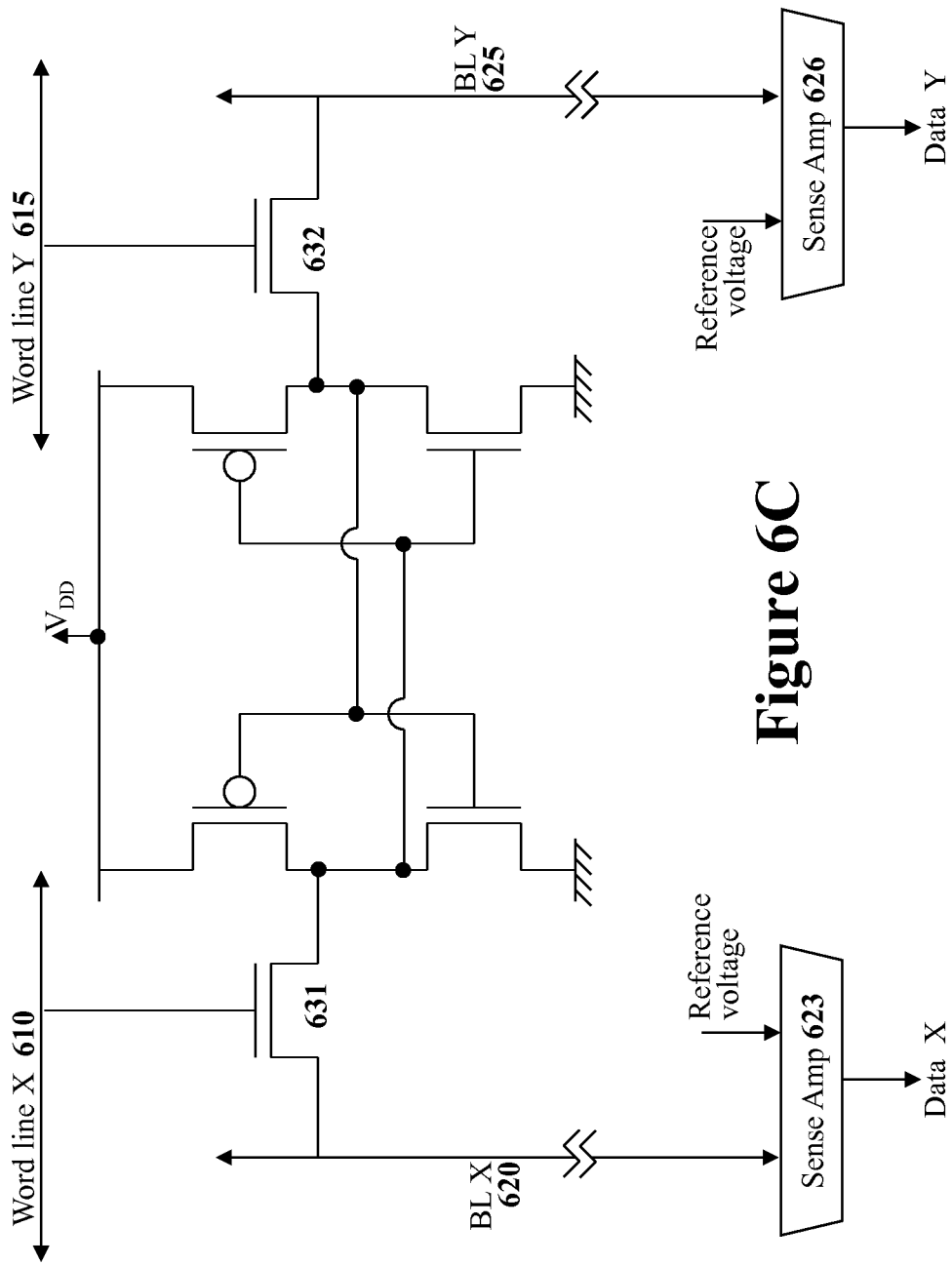
FIG. 6C illustrates a block diagram of the dual port 6T SRAM memory cell of FIG. 6A coupled to sense amplifiers for performing pseudo differential read operations.

FIG. 6C illustrates an arrangement for performing a pseudo differential read operation. In FIG. 6C each bit line is coupled to a sense amplifier that also has a synthetically generated voltage reference value as an input. The synthetically generated voltage reference value is somewhere between the voltage value for a logical "1" and the voltage value for a logical "0". During a pseudo differential read operation, the output of a bit line is compared against the synthetically generated voltage reference value to output a data value faster than can be achieved with direct single-ended read operation.

As illustrated in the embodiment of 6B, the sense amplifiers may be situated at the bottom of a memory array. However, this configuration requires the memory cells to drive very long bit lines. Driving long bit lines reduces the performance of the memory system. To improve upon this situation, the sense amplifiers may be placed in the middle of the memory array as illustrated in the embodiment of FIG. 6D. The synthetic voltage reference value generator circuits (REF) may be placed at the edges of the memory array and provide voltage reference values along bit lines that are not being used.

The arrangement of FIG. 6D allows read operations to either be performed as real differential read operations or pseudo differential read operations depending upon where in the memory array the two memory cells being read are located. FIGS. 7A to 7E illustrate various different read scenarios.

FIG. 7A illustrates a read scenario wherein the two read operations are directed toward memory cells in different halves of the memory array. When this occurs, normal differential read operations may be used since there is no resource conflict between the two different read operations in the two different array halves.

FIG. 7B illustrates a read scenario wherein the two read operations are directed toward the very same memory cell. (In the same half, same row, and same column of the memory array.) When this read scenario occurs, a single normal differential read operation may be performed and the control system sends two copies of the data from the single read operation.

FIG. 7C illustrates a read scenario wherein the two read operations are directed toward memory cells in the same half of the memory array and in the same row but in different columns. When this read scenario occurs, two normal differential read operations may be used since the two word lines in the same row will be activated.

FIG. 7D illustrates a read scenario wherein the two read operations are directed toward memory cells in the same half of the memory array but in different rows and in different columns. When this read scenario occurs, differential read operations cannot be used since activating both word lines in both rows would cause the system to attempt read from four different memory cells (A1, A2, B1, and B2). Thus, only one word line in each row is activated and two pseudo differential read operations are performed. In the embodiment of FIG. 7D, the reference voltage is obtained from the other half of the memory array.

FIG. 7E illustrates a read scenario wherein the two read operations are directed toward memory cells in the same half of the memory array and in the same column but in different rows. When this read scenario occurs, differential read operations cannot be used since there are only two bit lines in the column such that each read operation can only use one bit line. Thus, two pseudo differential read operations are performed. In the embodiment of FIG. 7E, the reference voltage is obtained from the other half of the memory array.

Two Writes Per Cycle with 6T Dual-Port SRAM

The previous two sections described how the 6T SRAM cell circuit of FIG. 6A can be used to implement a two-port memory system that handles two concurrent read operations in a single operating cycle. However, that memory system could only handle a single write operation in an operating cycle since both bit lines (620 and 625) were required to perform a standard differential write operation. As set forth in the preceding sections, the problem lies in the fact that it is very difficult if not impossible to write a logical "1" into a standard memory cell circuit. To handle this difficult situation, a logical "0" is written into the other side of a memory cell circuit and the inverter in the memory cell writes a logical "1" into the other side of the memory cell circuit.

Write operations into a memory array are generally much faster than read operations. Read operations generally require pre-charging of the bit lines and that pre-charging takes time. Furthermore, read operations must wait for the small memory cell circuits to sufficiently drive sense amplifiers before reading data values. Conversely, write operations can use driver circuits located outside of the memory array that are much larger and stronger than the standard transistors used within the individualized memory cell circuits in the memory array used to output data values during read operations. Thus, due to the larger driver circuits write operations generally require much less time to complete than read operations.

If a write operation can be completed in 't' amount of time and T is used as the time period for half of an operating cycle then a memory system may be constructed to handle two write operations within a single clock cycle. For example, a first write operation may occur on the rising edge of a clock cycle and the second write operation may occur on the falling edge of a clock cycle in a time division multiplexing (TDM) manner. FIG. 8A illustrates a timing diagram illustrating a clock signal at the top followed by the timing for two consecutive write operations that occur in a single clock cycle. The first write operation begins on a rising edge and completes before the second half the clock cycle. The second write operation begins on the falling clock edge and completes before the single clock cycle ends.

Various techniques may be used to optimize the write operations. For example, the memory system may cache write operations such that pre-decode and decode preparations may be completed for both write operations before the start of the write cycle. Thus, the write operations can be pipeline delayed. Write operations can always be cached and delayed as long as the memory control circuitry can identify and properly handle read operations that are addressed at data currently represented within the write cache.

The two-writes per clock cycle technique may be combined with the two-reads per cycle technique disclosed in previous sections in order to create a two-read or two-write per cycle SRAM cell circuit. The timing diagram of FIG. 8A illustrates both the two-writes per cycle technique (upper portion of FIG. 8A) and the two-reads per cycle technique (lower portion of FIG. 8A). The two-writes per cycle technique uses time division multiplexing (TDM) by performing two write consecutive write operations in a single operating cycle and the two-reads per cycle technique uses spatial division multiplexing (SDM) by performing two concurrent read operations with different port transistors and bit lines in a single operating cycle. Thus, the control logic for a memory system may implement both techniques in order to create a two-read or two-write per cycle (2R or 2W) SRAM memory system.

1R and 1W Per Cycle with 6T Dual-Port SRAM

A true dual port memory cell would be able to handle two independent write operations (2W), two independent read operations (2R), or one independent read operation and one independent write operation (1W and 1R) in a single cycle. However, it is difficult to combine the write operation and the read operation from the timing diagram of FIG. 8A into a single cycle because the write operation requires both bit lines (a spatial conflict) and the read operation requires more than half of an operating cycle (a timing conflict).

However, with some adjustments, it is possible to create a one read operation and one write operation memory cell circuit by combining the read and write techniques in FIG. 8A. In order to combine the two techniques, the write operation is modified to use both time division multiplexing and spatial division multiplexing. Specifically, instead of using both bit lines simultaneously for two different consecutive write operations, the write operation uses a first bit line for a first memory cell side during a first half of a memory cycle and the other bit line for the other memory cell side during the latter part of the second half of the memory cycle. As set forth earlier, it is difficult to write a logical "1" into a memory cell circuit but easy to write a logical "0" into the memory cell circuit. Thus, a full data value (consisting of both logical "1"s and "0"s) can be written into a memory cells by first writing the logical "0"s of the data value as logical "0"s into the data/true side of memory cells during a first half of a memory cycle and then writing the logical "1"s of the data value as logical "0"s into the data-complement/false side of memory cells during the latter part of the second half of a memory cycle.

Figure 8B:
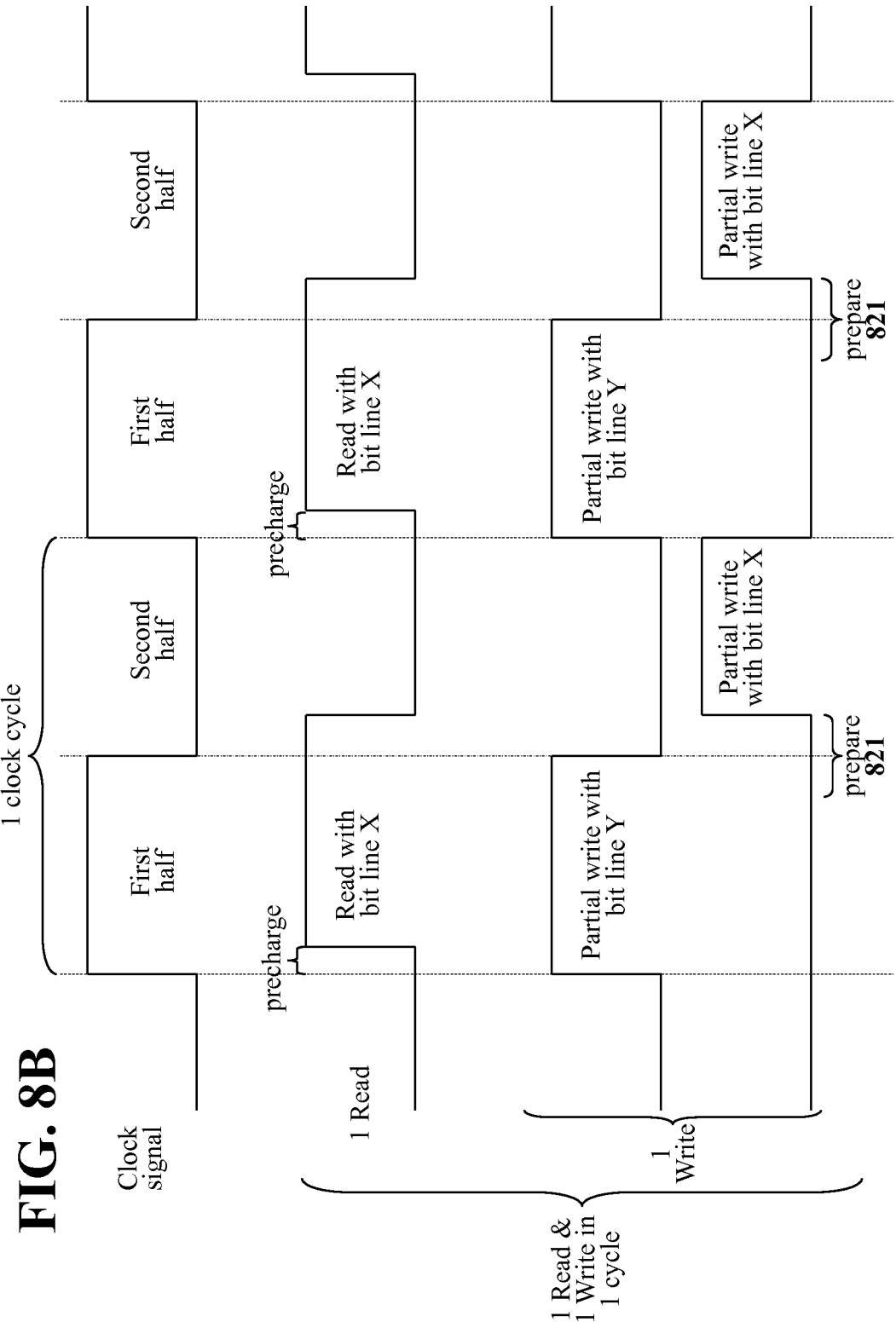
FIG. 8B illustrates a timing diagram for a memory system that handles one read and one write in a single clock cycle.

FIG. 8B illustrates a timing diagram for a memory system using the 6T SRAM cell having independently controllable port transistors (631 and 631) and bit lines (620 and 625) that can handle one read operation and one write operation within a single memory cycle. The read operation is handled by pre-charging and then performing a read operation with a single port transistor and bit line (Bit line X in the example of FIG. 8B). While the read operation is occurring, a simultaneous partial write operation is writing into one half of a memory cell using the other bit line, bit line Y. Since the read operation uses bit line X and the partial write operation in the first half of the clock cycle uses bit line Y, there is no resource conflict during the first half of clock cycle. The two operations are separated with spatial division multiplexing since different physical resources are used.

While performing the first partial-write operation, the write circuitry prepares for a second partial-write operation during time period 821. This preparation may include decoding and getting the write circuitry ready to drive the bit line to the desired state the moment the read operation is finished. When the read operation using bit line X completes, the write circuitry immediately begins a second partial-write operation using bit line X (that is no longer being used by the read operation). Since the read operation had completed using bit line X before the second partial-write operation begins in the second half of the clock cycle, there is no resource conflict due to time division multiplexing.

By performing two time division multiplexed (TDM) partial-write operations using both bit lines in a single cycle, the two partial-write operations using different bit lines complete a full write operation in a single clock cycle. Due to the preparation during time period 821, the second partial write operation may be complete a little faster than the first partial write operation.

In order to get the simultaneous one read and one write (1R and 1W) system of FIG. 8B to operate properly, the length of the clock cycle may need to be extended in order to accommodate both the read operation using a first bit line and the subsequent partial-write operation using that same bit line into the single clock cycle. Therefore the one read and one write (1R1W) memory system of FIG. 8B provides an ability to perform one read and one write in a single cycle but may not operate as fast as the previously disclosed two read and/or two write systems. Thus, other systems and techniques of performing one read and one write in a single clock cycle would be desirable.

If one drops the second partial-write operation from FIG. 8B, then the resulting memory system can perform one read and one-half of a write per clock cycle. Full write operations may be completed by performing two partial-write operations in sequential clock cycles. In this manner, the clock cycle can be reduced to the smallest size that allows for reliable single-ended read operation. Such a 1R0.5W memory system will be useful in certain applications wherein more read operations are required than write operations.

Improved 1R and 1W Per Cycle with 6T Dual-Port SRAM

In the previous section, one read and one write were performed in a single cycle by performing half of the write operation concurrently with the read operation and half of the write operation sequential to the read operation. Ideally, the write operation would be performed completely concurrently with the read operation. But since a write operation requires access to both sides of memory cells it is impossible to concurrently have a both a full read operation and a full differential write operation in a single memory cycle because of the resource conflict.

To circumvent this problem, a small write-buffer may be added to the memory system in order to hold write operations until they are complete. Specifically, the write buffer would store write operations such that instead of performing a full read operation and a full write operation in a single memory cycle, the system would perform a single full read operation and two different partial write operations in a single memory cycle. The following memory cycle would handle another full read operation and two more partial write operations that complete the partial write operations from the previous cycle. Thus, every two memory cycles, the memory system would perform two full read operations and two full write operations thereby averaging out to one read and one write operation every memory cycle. The write buffer would include circuitry to handle any read operations that attempt to access a data value at a memory address with a pending write operation.

Figure 8C:
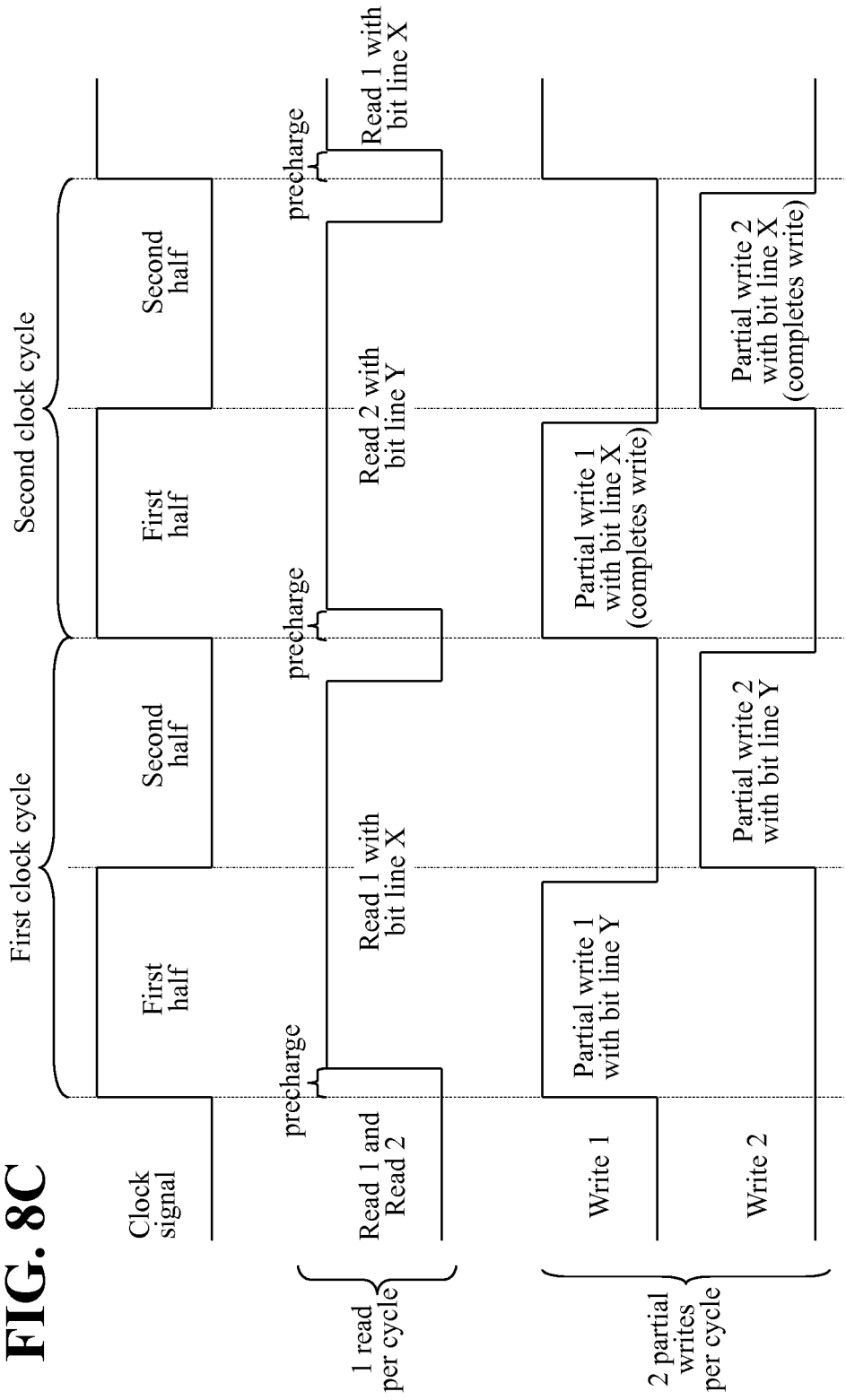
FIG. 8C illustrates a timing diagram for a memory system that handles a one read and two partial-write operations in a single clock cycle.

FIG. 8C illustrates a timing diagram that describes how a memory system with a small write buffer can easily perform two full read operations and two full write operations every two memory cycles without any resource conflicts. The four different memory operations that are handled in the two consecutive memory cycles of FIG. 8C are labelled Read 1, Read 2, Write 1, and Write 2. The read operations are performed as consecutive singled-ended read operations (that only require one port transistor and one bit line) but each require a full memory cycle to complete. The write operations each require access to both sides of the memory cells (with partial-writes for each side) but the accesses to the two different sides of the memory cells can be performed as partial-write operations in different memory cycles. Furthermore, the partial write operations can be completed in half of a memory cycle such that two partial operations using the same bit line can be performed in the same clock cycle.

Referring to FIG. 8C, the two read operations (Read 1 and Read 2) are performed in two different memory cycles and use two different bit lines. In the example, of FIG. 8C, Read 1 is performed in a first memory cycle using bit line X and then Read 2 is performed in a second memory cycle using bit line Y. The read operations are preceded by a pre-charging of the bit lines. The two read operations do not conflict with each other due to time division multiplexing (the two read operations occur in different memory cycles). The two read operations may be simple single-ended reads or (more likely) pseudo differential reads that only require access to a single side of a memory bit cell circuit. Sequential read operations in adjacent clock cycles will alternate back and forth between the X bit line and the Y bit line.

The two write operations (Write 1 and Write 2) are handled by dividing each write operation into two partial-write operations and performing two different partial-write operations in each memory cycle. In the first memory cycle, Write 1 performs a partial-write using bit line Y in the first half of the first memory cycle and Write 2 performs a partial-write using bit line Y in the second half of the first memory cycle. Note that both of these partial-writes uses bit line Y and thus do not conflict with Read 1 operation performed in the first memory cycle using bit line X. In the second memory cycle, Write 1 performs a partial-write using bit line X in the first half of the second memory cycle and Write 2 performs a partial-write using bit line X in the second half of the second memory cycle. Again, note that both of these two partial-write operations in the second clock cycle do not conflict with the concurrent Read 2 operation in the second clock cycle since the two partial-write operations use bit line X and the concurrent Read 2 operation uses bit line Y. Thus, FIG. 8C illustrates how a memory system with a write buffer may be constructed to handle one read and write operation in each memory cycle.

Note that in the memory system of FIG. 8C, a full read operation is handled every memory cycle. Thus memory read operations can be handled every memory cycle and are performed without introducing any latency at all. The memory write operations are spread across two different memory cycles such that there is some latency in completing memory write operations. However, as long as the write buffer circuitry can handle read operations to memory addresses that have uncompleted write operations by returning data from the write buffer, the latency in the write operations does not matter at all.

Algorithmic Enhancements with 6T Dual-Port SRAM

The techniques of the preceding sections may be improved with algorithmic enhancements that carefully schedule read and write operations for even better performance. Specifically, to perform a write operation, only a logical "0" in the proper half of the memory bit cell circuit needs to be performed since the inverter within the memory bit cell circuit will handle the write of a logical "1" into the other half of the memory cell circuit.

Figure 9A:
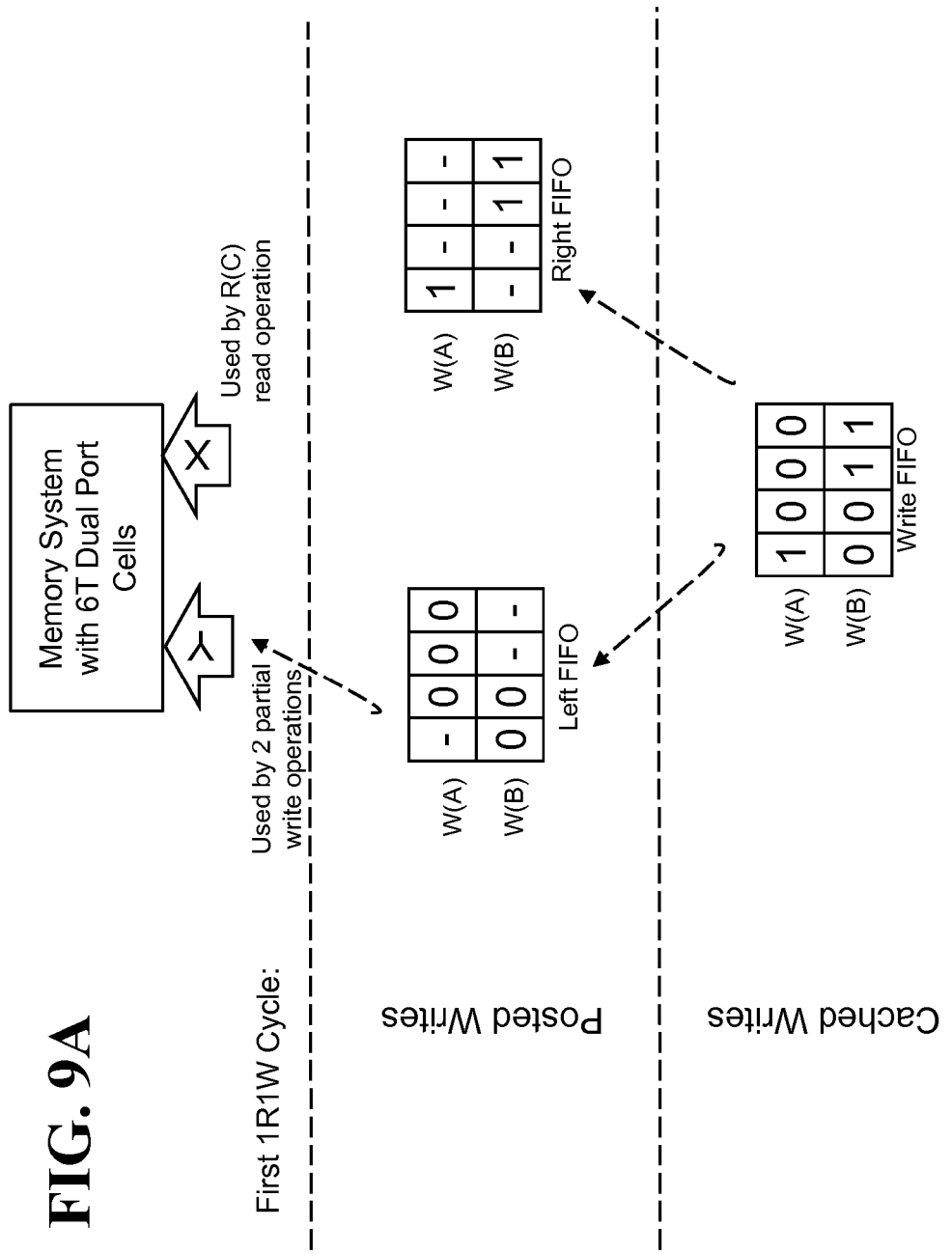
FIG. 9A conceptually illustrates two write operations divided into four partial-write operations wherein a first set of two partial-write operations and a first read operation are handled in a first clock cycle.
Figure 9B:
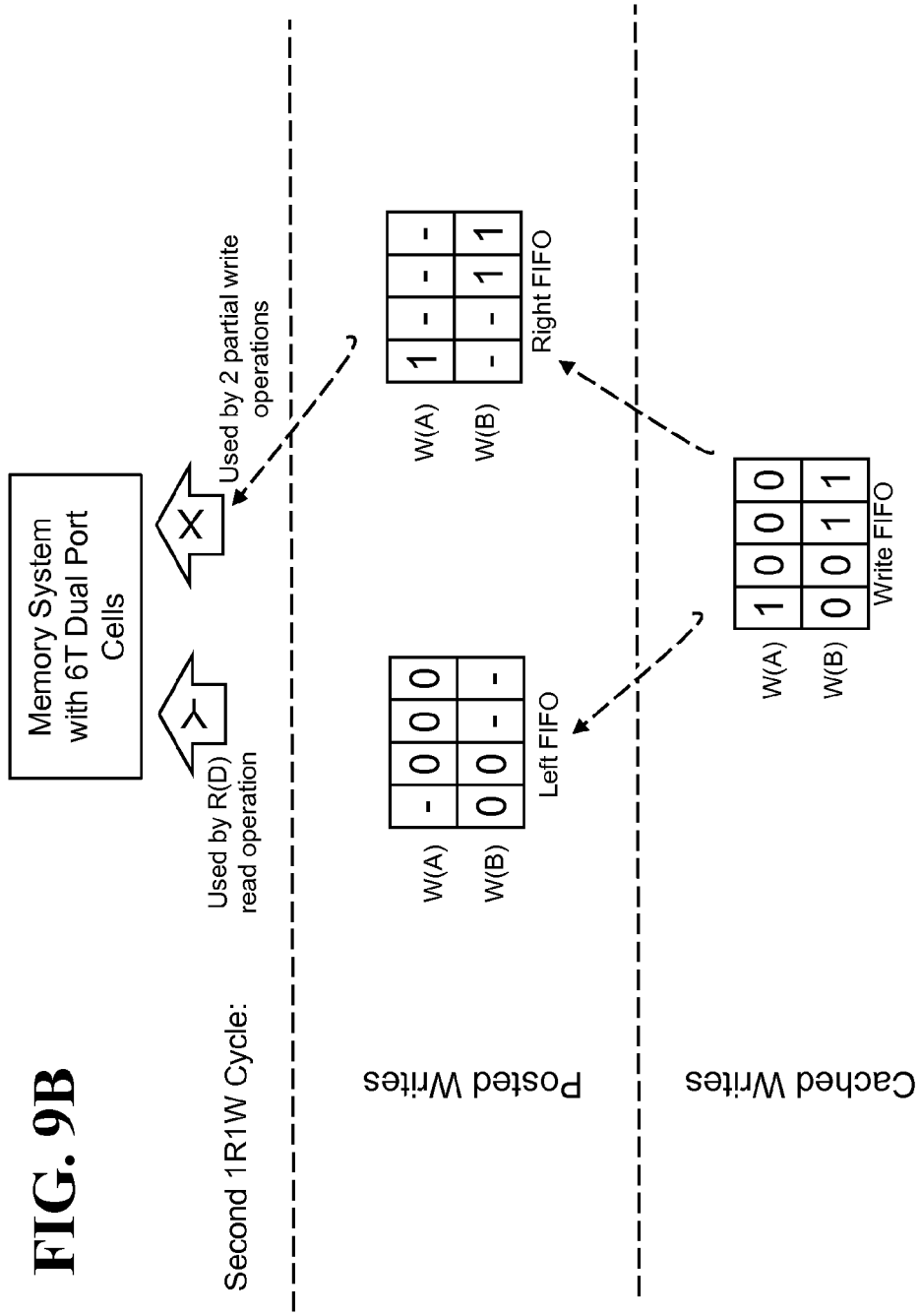
FIG. 9B conceptually illustrates two write operations divided into four partial-write operations wherein a second set of two partial-write operations and a second read operation are handled in a first clock cycle.
Figure 10A:
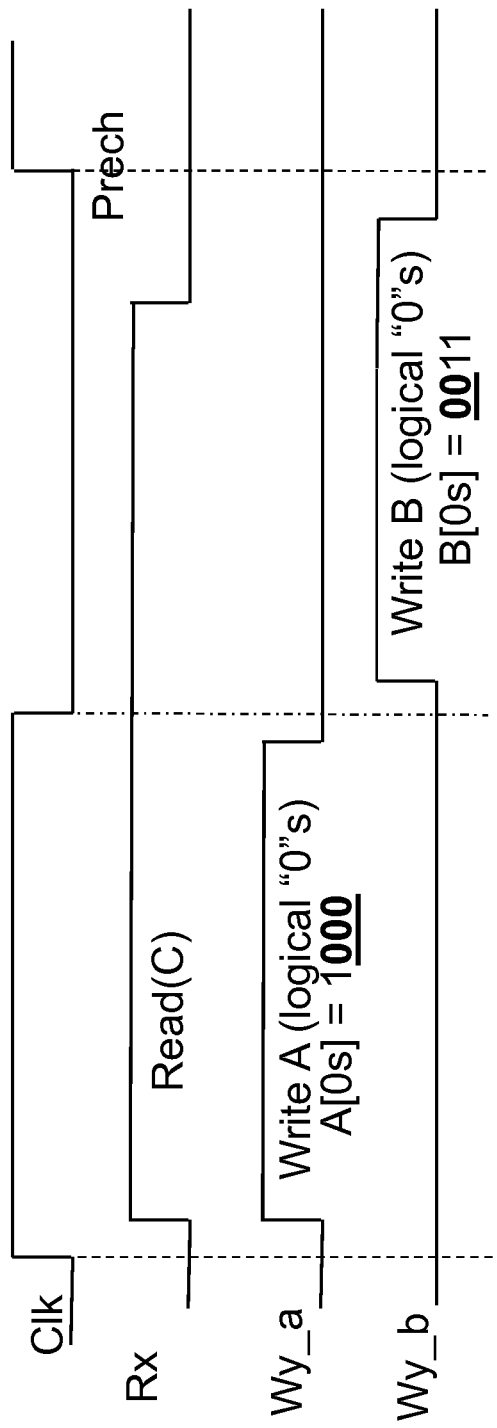
FIG. 10A illustrates a timing diagram for the two partial-write operations and read operations depicted in FIG. 9A.

FIGS. 9A, 9B, 10A, and 10B illustrate and example of how the one read and one write techniques may be used to handle two full four-bit wide write operations (W(A) and W(B)) and two full read operations (R(C) and R(D)) in two memory cycles. The bottom of FIG. 9A illustrates a pair of cached write operations wherein '1000' is being written to address A and '0011' is being written to address B. The middle of FIG. 9A illustrates those two write operations each split into two partial write operations. The left FIFO illustrates the logical "0" partial writes for the two write operations and the right FIFO illustrates the logical "1" partial writes for the two write operations. The top of FIG. 9A illustrates the left FIFO being used to write the logical "0"s using the Y bit lines while a read operation to address C occurs concurrently using the X bit lines in a first memory cycle. The timing diagram for the first memory cycle is illustrated in FIG. 10A. As illustrated in FIG. 10A, the read operation uses the X bit line whereas the two partial writes each use the Y bit lines to write logical "0"s.

Figure 10B:
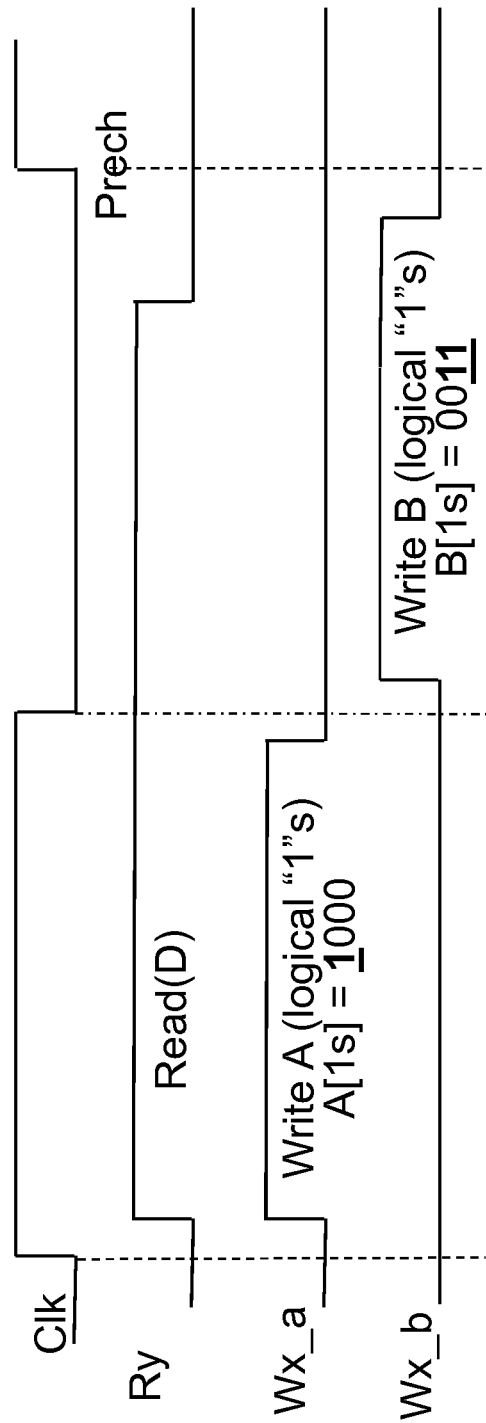
FIG. 10B illustrates a timing diagram for the two partial-write operations and read operations depicted in FIG. 9B.

FIG. 9B illustrates the same two cached write operations in the lower in middle portions. However, the top of FIG. 9B illustrates the right FIFO being used to write the logical "1"s using the X bit lines while a concurrent read operation accesses address D occurs using the Y bit lines in the second memory cycle. FIG. 10B illustrates accompanying timing diagram with the read operation to address D using the Y bit lines whereas the two partial writes each use the X bit lines to write logical "1"s into memory cells.

2 Writes Per Cycle with 6T Dual-Port SRAM with Split Writes

The technique of splitting each write operation into two partial write operations (a first write for logical "0"s and a second write for logical "1"s) described in the previous section can also be used to implement a two full writes per cycle memory system. For example, the bottom of FIG. 11A illustrates pair of cached write operations wherein '1000' is being written to address A and '0011' is being written to address B. The middle of FIG. 11A illustrates those two write operations each split into a pair of partial write operations wherein the left FIFO handles the logical "0" writes and the right FIFO handles the logical "1" writes.

The top of FIG. 11A illustrates all four partial write operations being written into the memory system in a single two full write memory cycle. FIG. 11B illustrates the timing diagram for the four partial write operations at the top of FIG. 11A. As illustrated in FIG. 11B, the four partial write operations are handled as two consecutive sets of partial write operations where there are no bit line conflicts for the concurrent write operations. In the example of FIG. 11B, in the first half of the memory cycle the logical "0"s are written into address A using the Y bit line and the logical "1"s are written into address B using the X bit line. Then in the second half of the memory cycle the logical "0"s are written into address B using the Y bit line and the logical "1"s are written into address A using the X bit line. Thus, as illustrated in FIGS. 11A and 11B, two write operations can be handled in a single memory cycle by splitting each write into two partial write operations. The system disclosed within FIGS. 11A and 11B is easier to combine with the one write and one read system disclosed in the previous section.

6T Dual-Port SRAM Summary

In the previous sections, read operations can always be performed using either one of two independently controlled ports into a memory cell. The data value read from a single port needs to be inverted if it is read from the data-complement/false side of the memory cell. The single port read operations may be simple single-ended reads but will generally be performed using a "pseudo differential read" technique in order to improve the performance of the read operation.

In the previous sections, write operations may be performed by using both bit lines simultaneously to perform normal differential write operations in some embodiments. However, write operations are often more efficiently handled by splitting the write operations into two partial writes: a first partial write to write logical "0"s (by writing zeros into the true/data side of a memory cell) and a second partial write to write to write logical "1"s (by writing zeros into the false/data-complement side of a memory cell). This allows the partial write operations to be moved around to avoid resource conflicts with other reads and writes.

All of the techniques described in the previous sections can be performed using the 6T Dual-Port SRAM disclosed in FIG. 6A that is largely the same as a standard 6T single-port SRAM cell except that there are now two independent word lines such that the two ports into the memory cell may be used independently. Thus, the preceding sets of techniques allow for a dual-port 6T memory cell that may be only slightly physically larger than a traditional single-port 6T SRAM cell. Since the word lines are routed on a higher metal layer, the size of the dual-port 6T memory cell may actually be the same size.

Writing in Batches Using Clear and Set

When writing into a memory system, the writing circuitry generally must be careful to access each individual address independently in order not to disturb data in other addresses. Thus, in the previous sections the write operations were split into logical "0" partial writes and logical "1" partial writes that were carefully arranged not to conflict with any other concurrent read or write operations that require the same resources. However, if a set of write operations were grouped together into a batch then a first operation could be used to perform an intentionally conflicting write operation to clear out all of the bits of the grouped write addresses and then subsequent independent write operations could be used to set the proper data bits for each individual write operation. The intentionally conflicting (or "aliased") write operation asserts the associated word lines and drives the bit lines for all the different bit locations that are intentionally being written to at the same time.

For example, the bottom of FIG. 12A illustrates four independent write operations directed at addresses A, B, C, and D. Traditionally, these four write independent operations can be handled as four independent writes (or eight partial write operations as set forth in the previous sections). The top of FIG. 12A illustrates an alternative method of handling these four write independent operations. Specifically, these four writes may be handled by first performing an intentionally conflicting (or "aliased") write operation that is directed to write logical zeros into all of the bit positions for addresses A, B, C, and D in a single write operation referred to as a "clear" operation. Then the memory system follows the clear operation by writing logical ones for each write in four additional individual write operations. The intentionally conflicting write operation is performed by writing a logical "0" into the true side of the memory cells for all the bits positions of addresses A, B, C, and D by activating all the proper word lines and bit lines simultaneously. The logical "1"s for the each write operation are then written into the specific addressed cells by performing four sequential writes of logical "1"s for the specific addresses A, B, C, and D. Thus, as set forth at the top of FIG. 12A, the four independent write operations to addresses A, B, C, and D are handled with five write cycles.

The five cycle system of handling four write operations disclosed in the top of FIG. 12A is slower than just performing four individual write operations that would only require write four cycles. However, the five cycle system disclosed at the top of FIG. 12A only uses half of the word line and bit line resources in the memory system during each write cycle. Specifically, the "Clear(A, B, C, D)" operation only uses data/true side word lines and bit lines and the four subsequent individual write operations only uses data-complement/false side word lines and bit lines. Thus, the other half of the memory system physical resources can be used to perform other concurrent memory operations.

The bottom of FIG. 12B illustrates four different independent write operations directed at addresses P, Q, R, and S. The four writes to addresses P, Q, R, and S can be performed concurrently with the four writes into addresses A, B, C, and D by using the other half of the word line and bit line resources in the memory system. Specifically, as illustrated in the top of FIG. 12B, a "Set(P, Q, R, S)" operation can be handled by concurrently performing an intentionally conflicting write operation that is directed to write logical "1"s into all the bit positions of addresses P, Q, R, and S in a single write operation that writes "0"s into the data-complement/false side of the memory cells. Note that this "Set(P, Q, R, S)" operation does not conflict with the concurrent "Clear(A, B, C, D)" operation that only uses the data/true side word lines and bit lines in the memory system. Next, a series of four independent write operations can write logical "0"s into addresses P, Q, R, and S as needed to complete these write operations to addresses P, Q, R, and S. These four independent write operations into addresses P, Q, R, and S only use the data/true side bit lines whereas the concurrent four write operations for addresses A, B, C, and D only use data-complement/false side bit lines such that there is no memory resource conflict. Thus, as illustrated in the example of FIGS. 12A and 12B, a batch of eight independent write operations may be handled with five cycles of write operations.

FIG. 13A conceptually illustrates the entire process of handling eight write operations in only five write cycles. At the bottom of FIG. 13A there are two sets of four cached writes to be written into the memory array. The left set of writes is converted into a "Clear(A, B, C, D)" operation (set all bits to zero) and a set of four writes of logical "1"s to complete the writes as displayed in the middle of FIG. 13A. The right set of writes is divided into a "Set(P, Q, R, S)" operation (set all bits to logical "1"s) and a set of four writes of logical "0"s to complete the writes as displayed in the middle of FIG. 13A.

At the top of FIG. 13A, all of the writes to create logical zeros have been moved to the left side and all of the writes to create logical ones have been moved to the right side. The Clear(A, B, C, D) and Set(P, Q, R, S) operations are performed first to clear all the bits in addresses A, B, C, D and set all the bits in addresses P, Q, R, S, respectively. Then the two sets of four writes follow to fill in the remaining data bits to complete the write operations. A set of four consecutive write operations write logical ones into the appropriate bit locations for addresses A, B, C, D and a set of four consecutive write operations write logical zeroes into the appropriate bit locations for addresses P, Q, R, S.

In the disclosure of FIG. 13A, two independent four entry caches allow eight independent write operations to be performed in five write cycles. (Note that the writes may be performed in half of a full memory cycle.) This system may easily be scaled to handle different batch sizes and word sizes. With two sets of eight entry caches then sixteen independent write operations may be handled in nine write cycles. In general, with two sets of N entry caches then the memory system can handle 2N independent write operations in N+1 write cycles. Note that this will be limited by the maximum number of word lines can be set or cleared simultaneously with the aliased set and clear operations. Due to current, timing, and process limitations, only a limited number of cells may be concurrently cleared and set.

The technique disclosed in FIG. 13A may be used to create memory systems that handle write operations at very fast rates. For example, in a memory system that can handle two write operations per memory cycle (by using both edges of a clock signal) and has two sets of four-entry caches the memory system, the memory system can perform 16 full independent write operations every five memory cycles. That is more than 3 writes per memory cycle and close to 4 writes per cycle. Even if only one physical write is performed per memory cycle, the system provides write rates that are close to 2 writes per cycle when the cache is sufficiently large since the system handles 2N/(N+1) writes per memory cycle.

Writing in Batches Using Clear and Set from Previous Batch Writes

Referring to FIG. 13A, the memory system can almost achieve two full write operations per write cycle or almost four writes per cycle if both clock edges are used. However, the need to perform the initial set and clear operations [Clear (A, B, C, D) and Set(P, Q, R, S)] prevent the memory system from completing an average of two full write operations in each write cycle. If the initial concurrent pair of set and clear operations could be eliminated then the memory system could perform two full write operations per write cycle (which is actually four full write operations per operating cycle if two write operations can be handled in each operating cycle using the clock edges).

Referring to the top of FIG. 13A, after the set and clear operations the memory system then carefully writes logical ones into the appropriate bit locations of addresses A, B, C, D and carefully writes logical zeroes into the appropriate bit locations of addresses P, Q, R, S to complete the write operations. If there is another set of cached write operations already queued up, then those carefully addressed write operations can be changed into intentionally aliased write operations that both write in the missing bits for the current write operations and handle the clear and set operations for the next set of write operations. Specifically, in the example of FIG. 13A the writes 1310 to addresses P, Q, R, and S write a logical zero to every bit position in the four bit wide data word. The logical-zero writes 1310 can be modified to also clear all the data bits for the next batch of four write operations. Similarly, the writes 1311 to addresses A, B, C, D that write a logical one to every bit position in the four bit wide data value can be modified to also set all the data bits for a subsequent batch of four write operations. In this manner, the Clear(A, B, C, D) and Set(P, Q, R, S) operations may be eliminated thus allowing the memory system to handle two full write operations per write cycle.

Figure 13B:
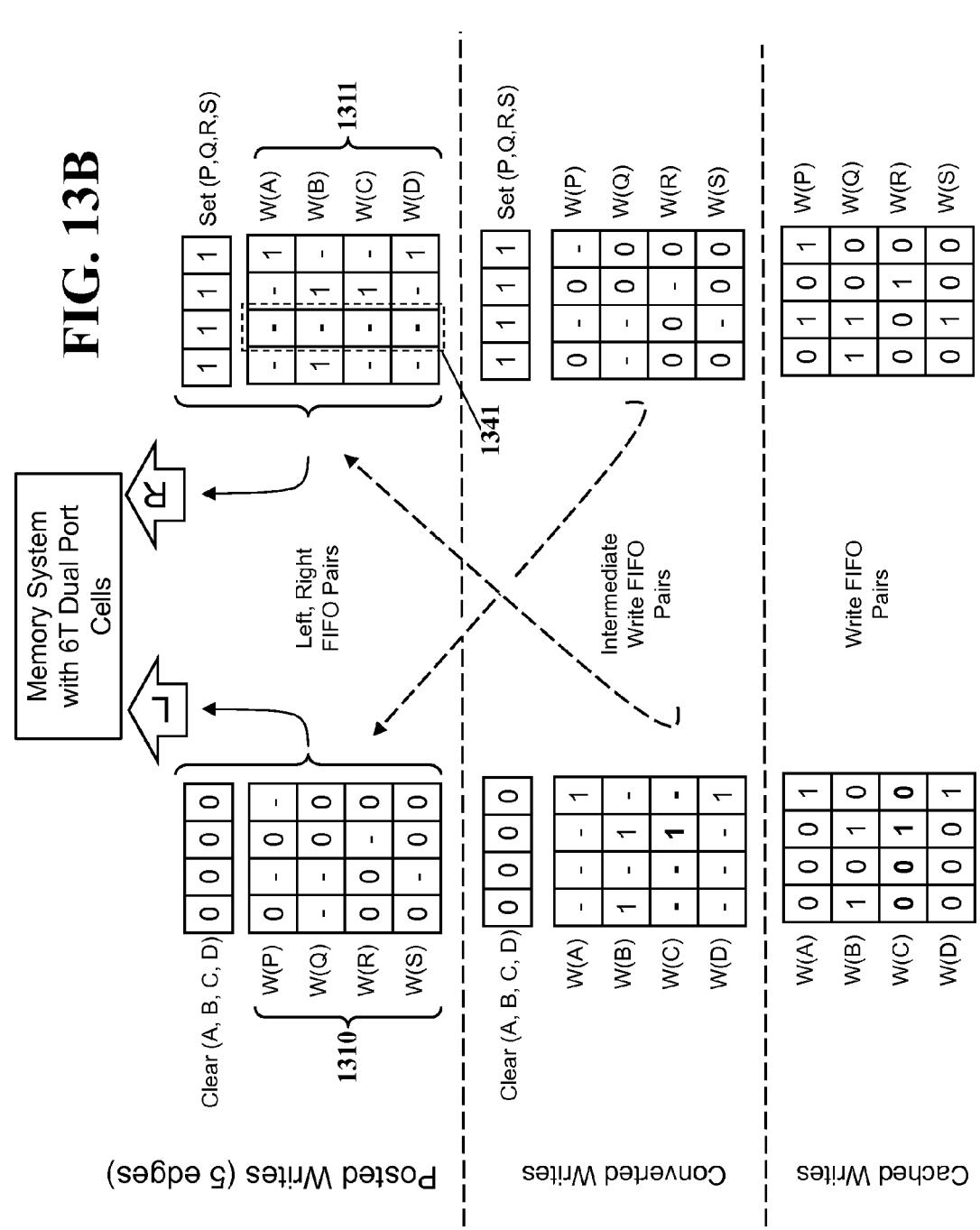
FIG. 13B conceptually illustrates how a data set that is missing a one bit in one column prevents a set of write operations from performing a group set operation for later writes.

Although this technique worked in the example of FIG. 13A, this technique will only work when every data bit position in the data word is affected by at least one of the writes (1310 and 1311) following the set and clear operations. FIG. 13B illustrates an example wherein the data written into address C is '0010' instead of '0110' as depicted in FIG. 13A. When the data value for the write to address C is changed to '0010' then the second column bit position 1341 of the data word is not written to by any of the writes 1311 of logical ones to addresses A, B, C, D. Thus, a full set operation for a subsequent batch of write operations cannot be performed. Instead, a set operation (or some other solution) will be required to complete the setting of bits for the next batch of write operations.

The problem disclosed in the example of FIG. 13B is that data values that will be written after a clear operation must have logical ones in every column (in order to perform a set operation for a subsequent batch of writes) and the data values that will be written after a set operation must have logical zeros in every column (in order to perform a clear operation for a subsequent batch of writes). To ensure that every bit position is written two, the memory system may store data values in their original form or in complemented form such that every column will contain at least one logical one or logical zero as necessary.

Figure 13C:
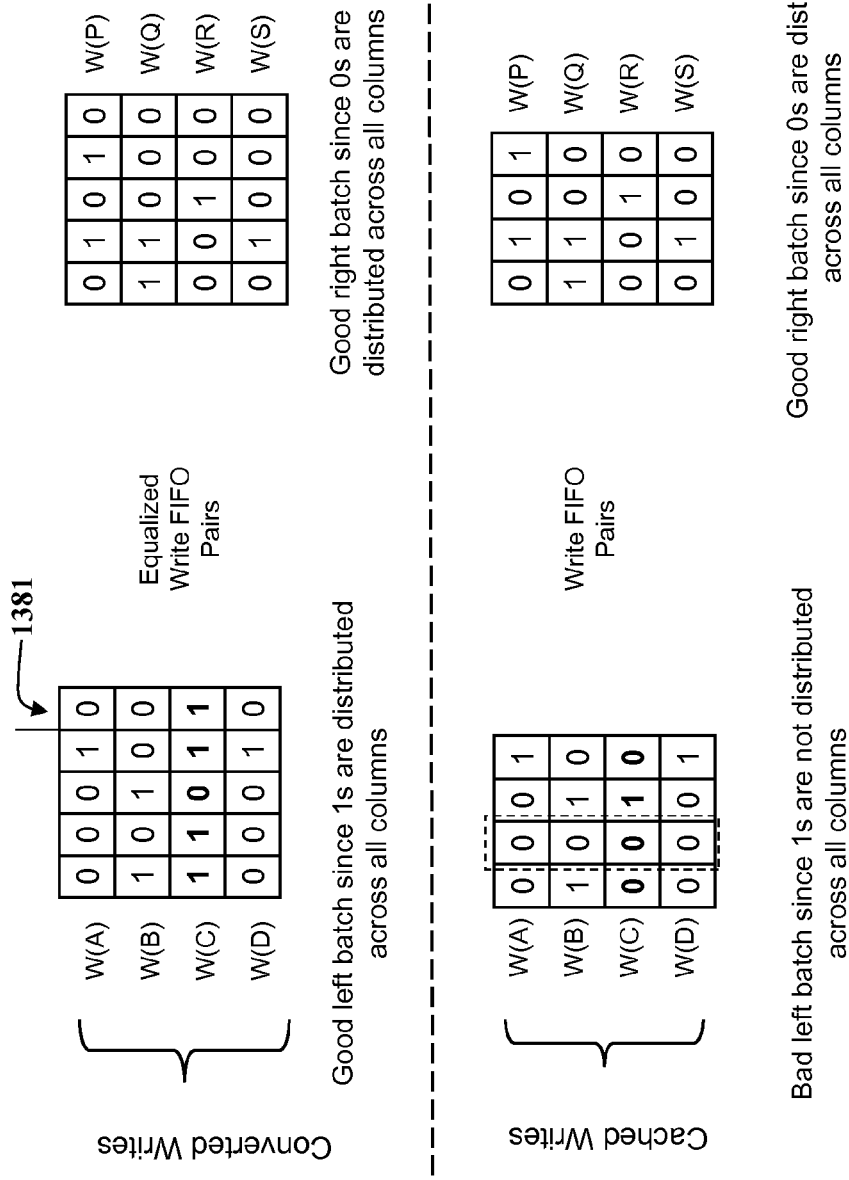
FIG. 13C illustrates how a data set that is missing a one bit in one column may be inverted to allow the data set to perform a group set for following write operations.

For example, the problem situation in FIG. 13B caused by the data value '0010' destined for address C may be remedied by using the complement '1101' of the original data value. FIG. 13C illustrates the original data at the bottom of FIG. 13C. To solve, the problem, the data from the bottom of the FIG. 13C is modified to ensure that every data column in the left batch has at least one logical one and that every data column in the right batch has at least one logical zero. This may be handled by changing that one data row destined for address C to its data complement '1101' as displayed in the middle of FIG. 13C. The converted writes illustrated in FIG. 13C include one more data column 1381 on the right end that specifies if the data value is complemented or not. Since only the data value for address C was changed, only that one row has the complement bit set in data column 1381.

To always ensure that the necessary data bits are available, the system may progressively store the original data value or the complemented data value with a data batch size of 1+ceiling($\log_2 W$) where W is the number of bits in each data word. FIG. 13D conceptually illustrates the process for a memory system that inverts data values as necessary to ensure that every data bit position in the data word will be affected by a write operation. In the example of FIG. 13D, only the left side data values that are written using the 'true' side of the memory cell are displayed.

The bottom of FIG. 13D illustrates a batch of four independent write operations for a seven bit wide data word. Since the data words will be written with a set operation (performed by an earlier batch of write operations) followed by a series of individual write operations that write logical zeros into the appropriate bit positions of the appropriate addresses, the memory system must convert the data words such that every column includes at least one logical zero value. In this manner, the set of write operations can simultaneous perform the "clear" operation for a subsequent batch of write operations. The memory system thus examines each write data value and determines if the data value should be inverted. In one system, the system proceed through the data values and ensures that at least half of the remaining data bit positions not handled yet contain logical zeros (or ones) as needed to perform a logical clear (or set) operation for the next batch of writes. Note that the added 'complement flag bit' 1381 is one of the bits that must be considered in this process.

Referring to the cached writes at the bottom of FIG. 13D, starting with the first data word, the memory system first ensures that at least four of data bits contain logical zeros. If four of the data bits are not logical zeros then the memory system will invert the data value such that four of the data bits will be logical zeros. In this example, the top data value is '0000111' that contains four logical zeros such that the data value is not inverted. For next data value, the system ensures that at least two of the remaining bit positions not yet covered contain logical zeros. In this example, the first data value was '0000111' such that the first four bits already have logical zeros. The second data value is '0000110' that contains only contains a single zero in the last three data positions such that the data value is inverted to become '1111001' thereby containing two logical zeros in the last three positions. For the third data value, the system ensures that at least one of the remaining two bits (the least significant bit and the 'complement flag bit' 1381) is zero. Since the original third data value is '0000111', that data value is inverted into '1111000' such that the least significant bit is zero. Finally, for the least data value, the system ensures that the final remaining bit, the 'complement flag bit' 1381, contains at least one zero. The top data value already left that bit zero such that no change is required for the final data value. Thus, the middle section of FIG. 13D illustrates a converted set of data values wherein every bit position (including the 'complement flag bit' 1381) contains at least one logical zero value.

At the top of FIG. 13D, the logical zeros of the converted data values are written into the memory system. The writes of the logical zeros are performed as aliased write operations that also write into every bit position for the addresses for a subsequent batch of writes in order to perform a "clear" operation for that next batch of write operations. The same procedure of converting the data values for a batch of four write operations is performed for the other side. Specifically, the other batch of data values is converted in a manner that ensures every bit position of the data word and the added 'data complement flag' includes at least one logical one. In this manner, the other batch of writes can perform a "set" operation for the next batch of write operations.

SUMMARY

This document has disclosed how a dual port six transistor memory cell may be created by using independent word lines such that each side of a memory cell may be accessed independently. With divided word lines, two independent read operations (2R) may occur concurrently. Write operations can occur faster than reads since the external write circuitry is larger than memory cells. If clock edges are used, then two independent write operations (2W) may be performed in a single clock cycle.

Various algorithmic techniques may be used to improve the dual port 6T memory cell. For example, write operations may be divided into partial writes of logical zeros and partial writes of logical ones. By dividing write operations in this manner, a memory system may perform an average of two writes or two reads per cycle by performing a read and two partial write operations in each clock cycle. This allows for a full dual port memory cell that can handle two reads, two writes, or one read and one write.

Batching write operations and using set and clear operations allows write operations to be performed as a pair of split batches. A first batch is written by clearing the addresses (writing in logical zeros) and then over-writing logical ones in as necessary. A second batch is concurrently handled by setting all the addresses (writing in logical ones) and then over-writing logical ones in as necessary. Finally, batched sets of write operations may be further improved by using the previous batch of write operations to clear and set the addresses for the next batch of addresses. Writing in batches increases the write performance for a memory system.

FIG. 14A illustrates a table of the various techniques and the performance that can be achieved using the various techniques when write operations are allowed to use clock edges such that two write operations can be performed in each memory cycle. As illustrated in the table of FIG. 14A, the various different techniques allow the memory system to provide as good and sometimes better performance using much less integrated circuit area. The first technique examined is the use of split word lines and the use of a reference voltage value used to perform pseudo differential read operations as listed in column 1410. This technique is described in the early sections of this document. The second technique examined (listed in column 1420) is the use of a zero write FIFO and a one write FIFO as described in the sections "Improved 1R and 1W Per Cycle With 6T Dual-Port SRAM" and "Two Writes Per Cycle With 6T Dual-Port SRAM With Split Writes". The third technique (listed in column 1430) is the use of set and clear caches as disclosed in the section "Writing in Batches Using Clear and Set". Finally, the fourth technique (listed in column 1440) is the use of algorithmic encoding that allows previous writes to clear & set memory as set forth in the section "Writing in Batches Using Clear and Set from Previous Batch Writes". FIG. 14B illustrates a table of the various techniques and the performance that can be achieved using the various techniques when only one write operation is performed in each memory cycle.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

We claim:

1. A dual port static random access memory cell, said dual port static random access memory cell comprising:
   a memory element, said memory element having a true side and a false side;
   a first bidirectional memory port, said first bidirectional memory port coupled to said true side, said first bidirectional memory port controlled by a first word line, said first bidirectional memory port coupled to a first bit line; and
   a second bidirectional memory port, said second bidirectional memory port coupled to said false side, said second bidirectional memory port controlled by a second word line, said second memory port coupled to a second bit line;
   wherein said first word line and said second word line are independently controllable such that said first bidirectional memory port and said second bidirectional memory port may be accessed independently.

2. The dual port static random access memory cell as set forth in claim 1 wherein said memory element comprises a pair of inverters.

3. The dual port static random access memory cell as set forth in claim 1 wherein said dual port static random access memory cell comprises a total of six transistors.

4. The dual port static random access memory cell as set forth in claim 1 further comprising:
   a voltage reference circuit, and
   a sense amplifier, said sense amplifier coupled to said voltage reference circuit and said first bit line;
   wherein a pseudo differential read operation may be performed by having said sense amplifier compare a data value on said first bit line with a reference voltage value generated by said voltage reference circuit.

5. A method of reading data from a memory array, said memory array comprising a plurality of dual port memory cells, each said dual port memory cell comprising a first bidirectional port into a first side of said dual port memory cell and a second bidirectional port into a second side of said dual port memory cell, said method comprising:
   reading first data bit using said first data bidirectional port into said first side of a first dual port memory cell; and
   concurrently reading a second data bit using said second bidirectional port into said second side of a second dual port memory cell and inverting said second data bit.

6. The method of reading data from a memory array as set forth in claim 5 wherein reading said first bit comprises performing a first pseudo differential read.

7. The method of reading data from a memory array as set forth in claim 6 wherein concurrently reading said second bit comprises performing a second pseudo differential read.

* * * * *